US012136635B2

(12) United States Patent
Kimizuka

(10) Patent No.: US 12,136,635 B2
(45) Date of Patent: Nov. 5, 2024

(54) IMAGING ELEMENT AND IMAGING DEVICE WITH SELECTION AND AMPLICATION TRANSISTOR GATES FORMED ON SAME SILICON CHANNEL

(71) Applicant: Sony Semiconductor Solutions Corporation, Kanagawa (JP)

(72) Inventor: Naohiko Kimizuka, Kanagawa (JP)

(73) Assignee: Sony Semiconductor Solutions Corporation, Kanagawa (JP)

( * ) Notice: Subject to any disclaimer, the term of this patent is extended or adjusted under 35 U.S.C. 154(b) by 0 days.

(21) Appl. No.: 18/468,002

(22) Filed: Sep. 15, 2023

(65) Prior Publication Data

US 2024/0021630 A1    Jan. 18, 2024

Related U.S. Application Data

(63) Continuation of application No. 17/294,239, filed as application No. PCT/JP2019/047778 on Dec. 6, 2019.

(30) Foreign Application Priority Data

Dec. 21, 2018  (JP) ................. 2018-239623

(51) Int. Cl.
 *H01L 27/146*    (2006.01)
 *H01L 29/78*    (2006.01)
 *H04N 25/77*    (2023.01)

(52) U.S. Cl.
 CPC .... *H01L 27/14612* (2013.01); *H01L 29/7855* (2013.01); *H04N 25/77* (2023.01)

(58) Field of Classification Search
 CPC ........... H01L 27/14612; H01L 29/7855; H01L 27/14616; H01L 27/14689; H01L 29/495;
 (Continued)

(56) References Cited

U.S. PATENT DOCUMENTS

2004/0141076 A1   7/2004 Ueno et al.
2007/0108538 A1   5/2007 Koyama
(Continued)

FOREIGN PATENT DOCUMENTS

CN   1340862 A   3/2002
CN   1529906 A   9/2004
(Continued)

OTHER PUBLICATIONS

International Search Report (PCT/ISA/210), International Application No. PCT/JP2019/047778, dated Feb. 20, 2020.
(Continued)

*Primary Examiner* — Gevell V Selby
(74) *Attorney, Agent, or Firm* — Michael Best & Friedrich LLP

(57) ABSTRACT

An imaging element and device configured for reduced image quality deterioration are disclosed. In one example, a pixel unit of the imaging element includes a selection transistor and an amplification transistor each constituted by a multigate transistor. The selection transistor and amplification transistor may be a FinFET that includes a silicon channel having a fin shape. Moreover, gates of the selection transistor and the amplification transistor may be formed on an identical silicon channel having a fin shape. Furthermore, for example, an ion having a smaller thermal diffusivity than a thermal diffusivity of boron or phosphorous is injected into the silicon channel of the selection transistor. In addition, for example, a work function of a material of a gate electrode of the selection transistor is different from a work function of a material of a gate electrode of the amplification transistor.

19 Claims, 22 Drawing Sheets

(58) Field of Classification Search
CPC ............... H01L 29/4975; H01L 29/167; H01L 29/66795; H01L 29/785; H01L 27/14614; H01L 27/14603; H04N 25/77; H04N 25/76; H04N 23/54
See application file for complete search history.

(56) References Cited

U.S. PATENT DOCUMENTS

| | | | |
|---|---|---|---|
| 2008/0197384 | A1 | 8/2008 | Hartwich et al. |
| 2010/0224917 | A1 | 9/2010 | Yamaguchi |
| 2015/0189214 | A1 | 7/2015 | Kurose |
| 2016/0204153 | A1* | 7/2016 | Tayanaka ............... H04N 25/68 257/229 |
| 2017/0224917 | A1 | 8/2017 | Friedrich |
| 2019/0103434 | A1 | 4/2019 | Kobayashi et al. |
| 2021/0384237 | A1* | 12/2021 | Yamakawa ............ H04N 25/79 |
| 2021/0400218 | A1* | 12/2021 | Nomoto ................. H04N 25/75 |

FOREIGN PATENT DOCUMENTS

| | | |
|---|---|---|
| CN | 101179051 A | 5/2008 |
| CN | 105474394 A | 4/2016 |
| CN | 108886046 A | 11/2018 |
| JP | 11-355668 A | 12/1999 |
| JP | 2001-168322 A | 6/2001 |
| JP | 2001-274384 A | 10/2001 |
| JP | 2002-076336 A | 3/2002 |
| JP | 2004-527127 A | 9/2004 |
| JP | 2006121093 A | 5/2006 |
| JP | 2007134650 A | 5/2007 |
| JP | 2010-206134 A | 9/2010 |
| JP | 2015046477 A | 3/2015 |
| JP | 2016-021479 A | 2/2016 |
| JP | 2017-183636 A | 10/2017 |
| KR | 20000005962 A | 1/2000 |
| KR | 20020018549 A | 3/2002 |

OTHER PUBLICATIONS

Notification of Transmittal of the International Search Report and the Written Opinion of the International Searching Authority, or the Declaration (PCT/ISA/220), International Application No. PCT/JP2019/047778, dated Mar. 3, 2020.

Written Opinion of the International Search Authority (PCT/ISA/237), International Application No. PCT/JP2019/047778, dated Mar. 3, 2020.

Chinese Office Action issued Jul. 31, 2024 for corresponding Chinese Application No. 201980082719.5.

* cited by examiner

FIG. 15

| | 1 | 2 | 3 | 4 | 5 | 6 | 7 | 8 | 9 | 10 | 11 | 12 | 13 | 14 | 15 | 16 | 17 | 18 |
|---|---|---|---|---|---|---|---|---|---|---|---|---|---|---|---|---|---|---|
| | 1A | 2A | 3A | 4A | 5A | 6A | 7A | 8 | 8 | 8 | 1B | 2B | 3B | 4B | 5B | 6B | 7B | O |
| 1 | H | | | | | | | | | | | | | | | | | He |
| 2 | Li | Be | | | | | | | | | | | B | C | N | O | F | Ne |
| 3 | Na | Mg | | | | | | | | | | | Al | Si | P | S | Cl | Ar |
| 4 | K | Ca | Sc | Ti | V | Cr | Mn | Fe | Co | Ni | Cu | Zn | Ga | Ge | As | Se | Br | Kr |
| 5 | Rb | Sr | Y | Zr | Nb | Mo | Tc | Ru | Rh | Pd | Ag | Cd | In | Sn | Sb | Te | I | Xe |
| 6 | Cs | Ba | | Hf | Ta | W | Re | Os | Ir | Pt | Au | Hg | Tl | Pb | Bi | Po | At | Rn |
| 7 | Fr | Ra | | | | | | | | | | | | | | | | |

WORK FUNCTION INCREASE →

CANDIDATE FOR nMOS: Ti, Zr, Hf, V, Nb, Ta, Cr, Mo, W

CANDIDATE FOR pMOS: Fe, Ru, Os, Co, Rh, Ir, Ni, Pd, Pt, Cu, Ag, Au

IMAGING ELEMENT AND IMAGING DEVICE WITH SELECTION AND AMPLICATION TRANSISTOR GATES FORMED ON SAME SILICON CHANNEL

CROSS REFERENCE TO RELATED APPLICATIONS

This is a Continuation Application of U.S. patent application Ser. No. 17/294,239, filed May 14, 2021, which is a 371 National Stage Entry of International Application No.: PCT/JP2019/047778, filed on Dec. 6, 2019, which in turn claims priority from Japanese Priority Patent Application JP 2018-239623 filed on Dec. 21, 2018, the entire contents of which are incorporated herein by reference.

TECHNICAL FIELD

The present disclosure relates to an imaging element and an imaging device, and particularly to an imaging element and an imaging device each capable of reducing deterioration of image quality.

BACKGROUND ART

A method which forms a vertical channel in an amplification transistor has been conventionally studied for reduction of an afterimage and a dark current produced in an imaging element (e.g., see PTL 1).

CITATION LIST

Patent Literature

PTL 1

Japanese Patent Laid-open No. 2006-121093

SUMMARY

Technical Problem

However, random noise, which is produced by an amplification transistor and a selection transistor and becomes a major source of pixel noise, is difficult to reduce by using the method described in PTL 1. Accordingly, image quality of a captured image generated by the foregoing type of imaging element may deteriorate.

The present disclosure has been developed in consideration of the aforementioned circumstances, and achieves reduction of deterioration of image quality.

Solution to Problem

An imaging element according to one aspect of the present technology is directed to an imaging element including a pixel unit that includes a selection transistor and an amplification transistor each constituted by a multigate transistor.

An imaging device according to one aspect of the present technology is directed to an imaging device including an imaging unit that images an object, and an image processing unit that performs image processing for image data obtained by imaging using the imaging unit. The imaging unit includes a pixel unit that includes a selection transistor and an amplification transistor each constituted by a multigate transistor.

According to the imaging element of the one aspect of the present technology, a pixel unit that includes a selection transistor and an amplification transistor each constituted by a multigate transistor is provided.

According to the imaging device of the other aspect of the present technology, an imaging unit that captures an image of an object, and an image processing unit that performs image processing for image data obtained by imaging using the imaging unit are provided. The imaging unit includes a pixel unit that includes a selection transistor and an amplification transistor each constituted by a multigate transistor.

BRIEF DESCRIPTION OF DRAWINGS

FIG. 15 is a diagram presenting a periodic table of elements.

DESCRIPTION OF EMBODIMENTS

Modes for carrying out the present disclosure (hereinafter referred to as embodiments) will be hereinafter described. Note that the description will be presented in the following order.

1. First embodiment (imaging element)
2. Second embodiment (imaging element)
3. Third embodiment (manufacturing device)
4. Fourth embodiment (imaging element)
5. Application examples
6. Application example to mobile body
7. Supplementary notes

1. First Embodiment

<Pixel Unit Configuration>

Figure 1:
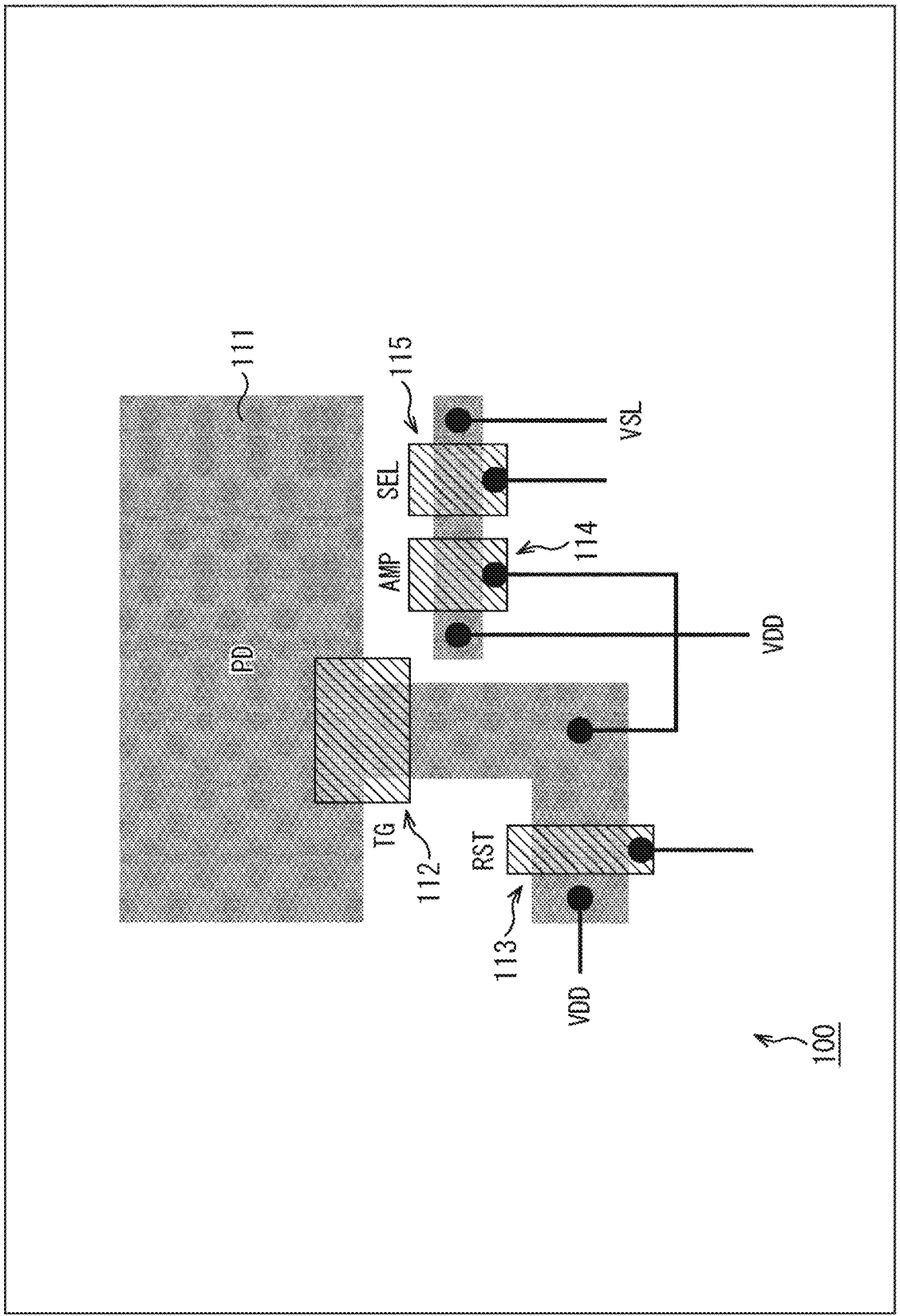
FIG. 1 is a plan diagram depicting a main configuration example of a pixel unit of an imaging element.

FIG. 1 is a plan diagram depicting a main configuration example of an imaging element to which the present technology has been applied. An imaging element 100 depicted in FIG. 1 is a CMOS (Complementary Metal Oxide Semiconductor) image sensor which captures an image of an object, and obtains the captured image as an electric signal. For example, the imaging element 100 has a plurality of pixel units disposed in a planar shape such as a form of an array. Incident light is photoelectrically converted at each of the pixel units to obtain a pixel signal of a captured image. FIG. 1 schematically depicts a main configuration example of one pixel unit of the imaging element 100 having this configuration.

As depicted in FIG. 1, the pixel unit of the imaging element 100 includes a photodiode (PD) 111, a transfer transistor (TG) 112, a reset transistor (RST) 113, an amplification transistor (AMP) 114, and a selection transistor (SEL) 115. Note that an element separation region or the like for separating the pixel unit from other pixel units, for example, can be formed in a white region in the figure. For example, the element separation region is constituted by an insulation film such as LOCOS (local oxidation of silicon) and STI (shallow trench isolation). In a case of electronic readout, the element separation region can also be constituted by a p-type region.

The photodiode 111 photoelectrically converts received light into a charge amount of photocharge (photoelectron herein) corresponding to the light amount of the received light, and accumulates the photocharge. An anode of the photodiode 111 is connected to a ground of a pixel region (grounded), while a cathode of the photodiode 111 is connected to a floating diffusion (FD) via the transfer transistor 112. Needless to say, also adoptable is such a system that the cathode of the photodiode 111 is connected to a power source of the pixel region (pixel power source), and that the anode of the photodiode 111 is connected to the floating diffusion via the transfer transistor 112 to read photocharge as a photohole.

The transfer transistor 112 controls readout of photocharge from the photodiode 111. The transfer transistor 112 is configured such that a drain is connected to the floating diffusion, and that a source is connected to the cathode of the photodiode 111. Moreover, a transfer control signal is supplied to a gate of the transfer transistor 112. Readout of photocharge from the photodiode 111 is controlled in accordance with this transfer control signal. For example, in a case where the transfer control signal (i.e., gate potential of the transfer transistor 112) is in an off-state, photocharge from the photodiode 111 is not transferred. In a case of an on-state, photocharge accumulated in the photodiode 111 is transferred to the floating diffusion. In other words, the transfer transistor 112 functions as a switch. Accordingly, the transfer transistor 112 is also referred to as a transfer switch.

The reset transistor 113 resets charge within the pixel unit (e.g., charge of the photodiode 111 and the floating diffusion). The reset transistor 113 is configured such that a drain is connected to a power source potential (VDD), and that a source is connected to the floating diffusion. Moreover, a reset control signal is supplied to a gate of the reset transistor 113. Reset of charge within the pixel unit is controlled in accordance with this reset control signal. For example, in a case where the reset control signal (i.e., gate potential of the reset transistor 113) is in an off-state, charge is not reset. In an on-state, charge within the pixel unit is reset.

The amplification transistor 114 amplifies a potential change of the floating diffusion, and outputs the amplified potential change as an electric signal (analog signal). Specifically, the amplification transistor 114 functions as a readout circuit which reads out a voltage of the floating diffusion. The amplification transistor 114 is configured such that a gate is connected to the floating diffusion, that a drain is connected to a source follower power source voltage (VDD), and that a source is connected to a drain of the selection transistor 115. For example, the amplification transistor 114 outputs, to the selection transistor 115, a reset signal (reset level) corresponding to a potential of the floating diffusion in a reset state. Moreover, the amplification transistor 114 outputs, to the selection transistor 115, a light accumulation signal (signal level) corresponding to a potential of the floating diffusion in a state where photocharge has been transferred from the photodiode 111.

The selection transistor 115 controls output of an electric signal supplied from the amplification transistor 114 to a signal line (VSL). The selection transistor 115 is configured such that a drain is connected to the source of the amplification transistor 114, and that a source is connected to the signal line (VSL). Moreover, a selection control signal is supplied to a gate of the selection transistor 115. Output of the electric signal supplied from the amplification transistor 114 to the signal line (VSL) is controlled in accordance with this selection control signal. For example, in a case where the selection control signal (i.e., gate potential of the selection transistor 115) is in an off-state, signals such as a reset signal and a pixel signal are not output to the signal line (VSL) from the corresponding pixel unit. On the other hand, in a case where the selection control signal is in an on-state, signals (a reset signal, a pixel signal, and the like) output from the amplification transistor 114 are output to the signal line (VSL). This signal line is connected to a circuit (e.g., A/D conversion circuit or the like) disposed outside the pixel region constituting the pixel unit. A signal output to the signal line (VSL) (i.e., a signal read from the corresponding pixel unit) is transferred to the circuit disposed outside the pixel region via the corresponding signal line (VSL).

<Pixel Noise>

A method which forms a vertical channel in an amplification transistor has been conventionally studied for reduction of an afterimage and a dark current of the imaging element 100 configured as presented in PTL 1, for example.

In actual situations, however, random noise coming from an amplification transistor and a selection transistor has been a major source of noise produced for each pixel unit (also referred to as pixel noise). Accordingly, by using the method described in PTL 1, the random noise is difficult to decrease, and thus an increase in the pixel noise is difficult to reduce. As a consequence, image quality of a captured image generated by the imaging element 100 of the type described above may deteriorate.

<Application of Multigate Transistor>

For overcoming this problem, a multigate transistor is adopted for each of the selection transistor 115 and the amplification transistor 144. The multigate transistor is a non-planar type (non-flat type) transistor where a plurality of gate electrode surfaces is three-dimensionally formed with respect to a channel.

By employing the multigate transistors to constitute both the selection transistor 115 and the amplification transistor 114 as described above, both the selection transistor 115 and the amplification transistor 114 are allowed to have longer effective channel widths. Accordingly, an increase in random noise can be more reduced (typically, random noise can be more reduced) than in a case where at least either the selection transistor 115 or the amplification transistor 114 is a planar type (flat type). In other words, image quality deterioration of a captured image can be reduced (typically, improvement of image quality can be achieved).

Moreover, in a case of a planar type (flat type) FET, for example, a predetermined size is required for each of low-resistance source and drain to uniformly form these source and drain in a channel width direction. Even if a transistor including a vertical channel is used as the amplification transistor 114 as described in PTL 1, a predetermined size is required between a gate electrode of the amplification transistor 114 and the selection transistor 115 so as to highly accurately form a silicon channel of the amplification transistor 114 using lithography with no effect of a diffusion layer portion of the selection transistor 115 on the silicon channel. As apparent from above, a predetermined distance is needed between gate electrodes of the selection transistor 115 and the amplification transistor 114.

By employing the multigate transistors to constitute both the selection transistor 115 and the amplification transistor 114 as described above, an increase in the distance required between the gate electrodes of the selection transistor 115 and the amplification transistor 114 can be reduced (typically, this distance can be more shortened) than in a case where at least either the selection transistor 115 or the amplification transistor 114 is a planar type. Accordingly, an increase in the size of the pixel unit can be more reduced (typically, miniaturization of the pixel unit can be more facilitated) than in a case where at least either the selection transistor 115 or the amplification transistor 114 is a planar type.

<FinFET>

For example, a FinFET may be employed to constitute each of the amplification transistor 114 and the selection transistor 115. The FinFET is an example of the multigate transistor, and is an FET (Field Effect Transistor) which includes a silicon channel having a fin shape (standing type) and formed between a source and a drain of the FET, and a gate electrode formed in such a manner as to cover the silicon channel.

Figure 2:
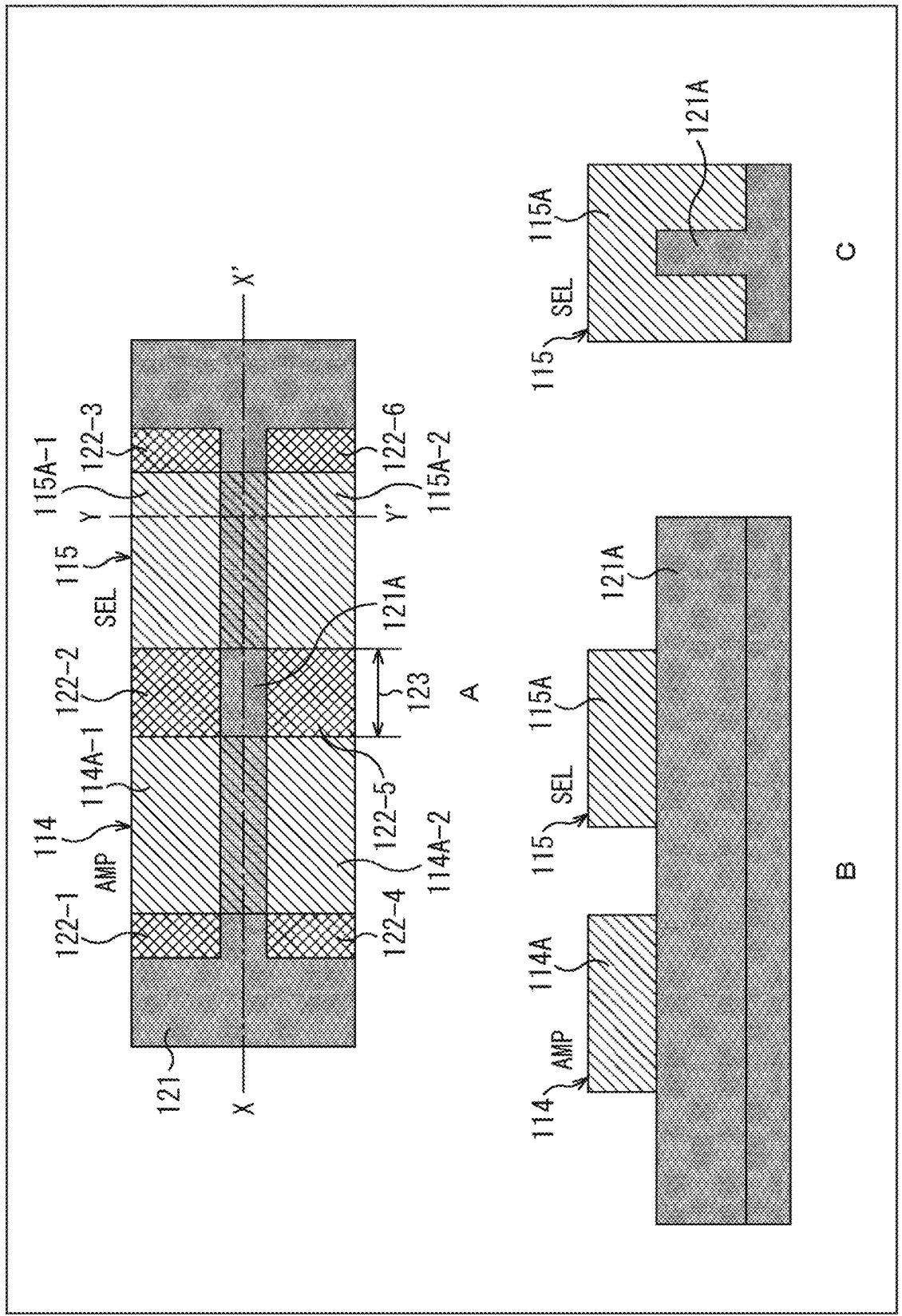
FIG. 2 depicts diagrams depicting a main configuration example of an amplification transistor and a selection transistor.

A part A of FIG. 2 is a plan diagram depicting a main configuration example of the amplification transistor 114 and the selection transistor 115. As depicted in the figure, the amplification transistor 114 is provided in a left part of the figure, while the selection transistor 115 is provided in a right part of the figure. Accordingly, the amplification transistor 114 and the selection transistor 115 are formed adjacent to each other.

More specifically, a silicon channel 121A having a fin shape is provided on a silicon layer 121. A gate electrode 114A (gate electrode 114A-1 and gate electrode 114A-2) is formed in such a manner as to cover the silicon channel 121A to constitute the amplification transistor 114. Moreover, a gate electrode 115A (gate electrode 115A-1 and gate electrode 115A-2) is formed in such a manner as to cover the silicon channel 121A to constitute the selection transistor 115. Accordingly, the gate electrode 115A of the selection transistor 115, and the gate electrode 114A of the amplification transistor 114 are both provided on the same silicon channel 121A.

Furthermore, insulation films 122-1 to 122-6 are formed on both sides (upward direction and downward direction in the figure) of the silicon channel 121A having a fin shape in a portion other than the amplification transistor 114 and the selection transistor 115. In a case where no distinction between the insulation films 122-1 to 122-6 is needed in the description, each of the insulation films 122-1 to 122-6 will be collectively referred to as an insulation film 122. For example, each of the insulation films 122 includes silicon dioxide ($SiO2$).

A part B of FIG. 2 depicts an example of a cross-sectional diagram taken along one-dot chain line X-X' in the configuration depicted in the part A of FIG. 2. As depicted in the part B of FIG. 2, the gate electrode 114A is also provided on the upper side of the silicon channel 121A. Accordingly, together with the gate electrodes 114A-1 and 114A-2 in the part A of FIG. 2, the gate electrode 114A of the amplification transistor 114 is so provided as to cover the silicon channel 121A having a fin shape. As apparent from above, the amplification transistor 114 is what is called a FinFET (has what is called a FinFET structure).

Similarly, the gate electrode 115A is also provided on the upper side of the silicon channel 121A. Accordingly, together with the gate electrodes 115A-1 and 115A-2 in the part A of FIG. 2, the gate electrode 115A of the selection transistor 115 is so provided as to cover the silicon channel 121A having a fin shape. A part C of FIG. 2 depicts an example of a cross-sectional diagram taken along one-dot chain line Y-Y' in the configuration depicted in the part A of FIG. 2. As depicted in the part C of FIG. 2, the gate electrode 115A of the selection transistor 115 is so provided as to cover the silicon channel 121A having a fin shape. As apparent from above, the amplification transistor 114 is what is called a FinFET (has what is called a FinFET structure).

By employing the FinFET to constitute each of the selection transistor 115 and the amplification transistor 114 as described above, both the gate electrodes of the selection transistor 115 and the amplification transistor 114 are allowed to have longer effective channel widths. Accordingly, an increase in random noise can be more reduced than in a case where at least either the selection transistor 115 or the amplification transistor 114 is a planar type (flat type). In other words, image quality deterioration of a captured image can be reduced (typically, improvement of image quality can be achieved).

Meanwhile, as depicted in the part A of FIG. 2, the amplification transistor 114 and the selection transistor 115 (gate electrode 114A and gate electrode 115A) are formed (disposed) with a predetermined clearance left between each other. This clearance is produced by the silicon channel 121A, the insulation film 122-2, and the insulation film 122-5 as indicated by a double-headed arrow 123.

By employing the FinFET to constitute each of the amplification transistor 114 and the selection transistor 115 as described above, a size required for uniformly forming low-resistance source and drain in the channel width direction in the case of the planar type (flat type) FET can be reduced for both of the amplification transistor 114 and the selection transistor 115. Moreover, the necessity of considering the effect of the diffusion layer portion of the selection transistor 115 during formation of the silicon channel is eliminated. Accordingly, an increase in the distance required between the amplification transistor 114 and the selection transistor 115 (gate electrode 114A and the gate electrode 115A) as indicated by the double-headed arrow 123 can be reduced. As a result, an increase in the size of the pixel unit can be more reduced than in the case where at least either the selection transistor 115 or the amplification transistor 114 is a planar type.

Moreover, by disposing the amplification transistor 114 and the selection transistor 115 adjacent to each other as described above, an increase in the distance between the amplification transistor 114 and the selection transistor 115 (gate electrode 114A and the gate electrode 115A) can be more reduced. Furthermore, by providing both the gate electrode 115A of the selection transistor 115 and the gate electrode 114A of the amplification transistor 114 on the same silicon channel 121A as described above, a structure of the pixel unit can be more simplified (made simpler). Accordingly, a size increase of the pixel unit can be more reduced.

2. Second Embodiment

<Injection of Impurity>

Note that an impurity (dopant) may be injected into a portion corresponding to the selection transistor 115 (a portion covered by the gate electrode 115A) in the silicon channel 121A. In other words, the selection transistor 115 may include a silicon channel into which a dopant has been injected.

In a case where an off-characteristic is given priority for the selection transistor 115 adopting a FinFET as described above, it is preferable that an on-off threshold voltage Vth is set higher in comparison with a case where the off-characteristic is not given priority. Moreover, in a case where a modulation degree or a saturated charge amount is given priority, it is preferable that the on-off threshold voltage Vth is set lower in comparison with a case where the modulation degree or the saturated charge amount is not given priority.

Figure 3:
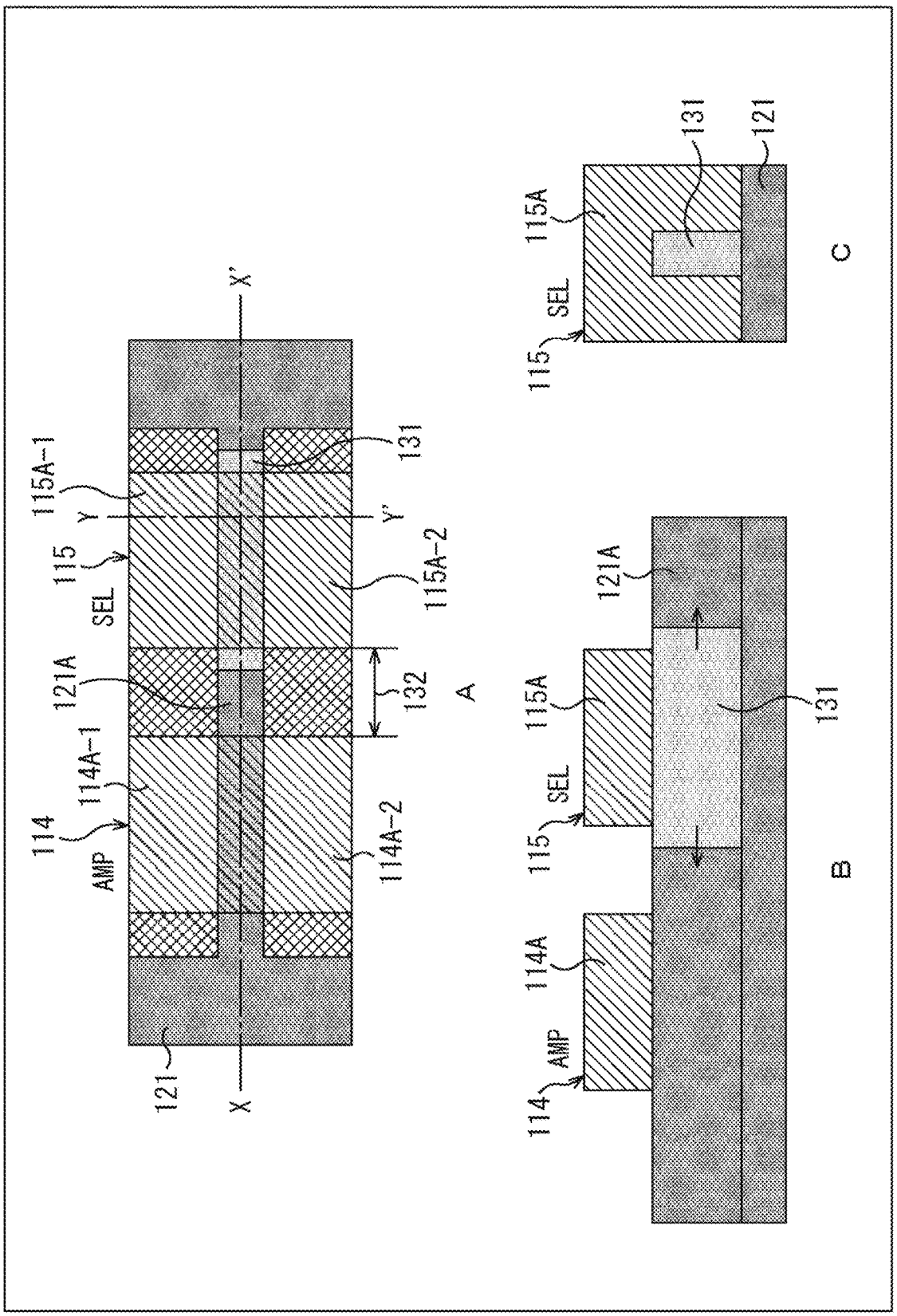
FIG. 3 depicts diagrams depicting another configuration example of the amplification transistor and the selection transistor.

A part A of FIG. 3 is a plan diagram depicting a main configuration example of the amplification transistor 114 and the selection transistor 115 in this case. In the case of the example depicted in FIG. 3, an ion injection region 131 into which an ion as a dopant has been injected is formed in a portion corresponding to the selection transistor 115 in the silicon channel 121A having a fin shape.

A part B of FIG. 3 depicts an example of a cross-sectional diagram taken along one-dot chain line X-X' in the configuration depicted in the part A of FIG. 3. A part C of FIG. 3 depicts an example of a cross-sectional diagram taken along one-dot chain line Y-Y' in the configuration depicted in the part A of FIG. 3. In this manner, the ion injection region 131 is formed in the portion corresponding to the selection transistor 115 in the silicon channel 121A having a fin shape.

The threshold voltage Vth of the selection transistor 115 is controllable as described above by injecting an ion as a dopant into the silicon channel 121A to form the ion injection region 131 as described above. For example, the ion injection region 131 is providable as a P-type semiconductor by injecting boron (B) as a dopant into the portion corresponding to the selection transistor 115 in the silicon channel 121A having a fin shape. Specifically, the threshold voltage Vth of the selection transistor 115 can be made higher than the threshold voltage Vth in a case where no dopant is injected. Moreover, for example, the ion injection region 131 is providable as an N-type semiconductor by injecting phosphorous (P) as a dopant into the portion corresponding to the selection transistor 115 in the silicon channel 121A having a fin shape. Specifically, the threshold voltage Vth of the selection transistor 115 can be made lower than the threshold voltage Vth in a case where no dopant is injected.

However, each of boron (B) and phosphorous (P) described above causes thermal diffusion relatively easily (has a relatively large thermal diffusivity). When a dopant which easily causes thermal diffusion (has a large thermal diffusivity) is used, this dopant diffuses from the region of the selection transistor 115 to the region of the amplification transistor 114 (i.e., the ion injection region 131 expands to the portion of the amplification transistor 114) by the following heat treatment. In this case, Vth controllability of the amplification transistor 114 may deteriorate, or 1/f noise may increase according to an increase in MOS interface electron density. Accordingly, image quality of a captured image may deteriorate.

For overcoming this problem, an ion having a smaller thermal diffusivity than that of boron (B), for example, may be injected as a dopant into the portion corresponding to the selection transistor 115 in the silicon channel 121A. In other words, the selection transistor 115 may include a silicon channel into which an ion having a smaller thermal diffusivity than that of boron (B) has been injected. For example, indium (In) may be injected as this type of dopant.

In this manner, diffusion of the ion injection region 131 (the portion corresponding to the selection transistor 115 in the silicon channel 121A) in a manner indicated by arrows in the part B of FIG. 3 can be more reduced than in a case where boron (B) is used as a dopant. Accordingly, deterioration of Vth controllability of the amplification transistor 114, and an increase in 1/f noise according to an increase in MOS interface electron density can be reduced. Specifically, improvement of the off-characteristic of the selection transistor 115 is achievable while reducing deterioration of Vth controllability of the amplification transistor 114 and an increase in 1/f noise. In other words, image quality deterioration of a captured image can be reduced (typically, improvement of image quality can be achieved).

Moreover, an ion having a smaller thermal diffusivity than that of phosphorous (P), for example, may be injected into the portion corresponding to the selection transistor 115 in the silicon channel 121A as a dopant. In other words, the selection transistor 115 may include a silicon channel into which an ion having a smaller thermal diffusivity than that of phosphorous (P) has been injected. For example, arsenic (As) may be injected as this type of dopant. Moreover, for example, antimony (Sb) may be injected as this type of dopant.

In this manner, diffusion of the ion injection region 131 (the portion corresponding to the selection transistor 115 in the silicon channel 121A) in a manner indicated by the arrows in the part B of FIG. 3 can be more reduced than in a case where phosphorous (P) is used as a dopant. Accordingly, deterioration of Vth controllability of the amplification transistor 114, and an increase in 1/f noise according to an increase in MOS interface electron density can be reduced. Specifically, improvement of the modulation degree and the saturated charge amount of the selection transistor 115 is achievable while reducing deterioration of Vth controllability of the amplification transistor 114 and an increase in 1/f noise. In other words, image quality deterioration of a captured image can be reduced (typically, improvement of image quality can be achieved).

Moreover, in this manner, diffusion of the ion injection region 131 can be more reduced by using an ion having a smaller thermal diffusivity than a thermal diffusivity of each of boron (B) and phosphorous (P) as a dopant than in a case where boron (B) or phosphorous (P) is used as a dopant as described above. Accordingly, an increase in the distance (a length of a double-headed arrow 132 in FIG. 3) required between the amplification transistor 114 and the selection transistor 115 (gate electrode 114A and gate electrode 115A) can be reduced. As a result, a size increase of the pixel unit can be more reduced.

<Distance Between AMP and SEL>

Subsequently described will be a distance required between the amplification transistor 114 and the selection transistor 115 (gate electrode 114A and gate electrode 115A) as indicated by the double-headed arrow 123 in the part A of FIG. 2 and the double-headed arrow 132 in the part A of FIG. 3.

Figure 4:
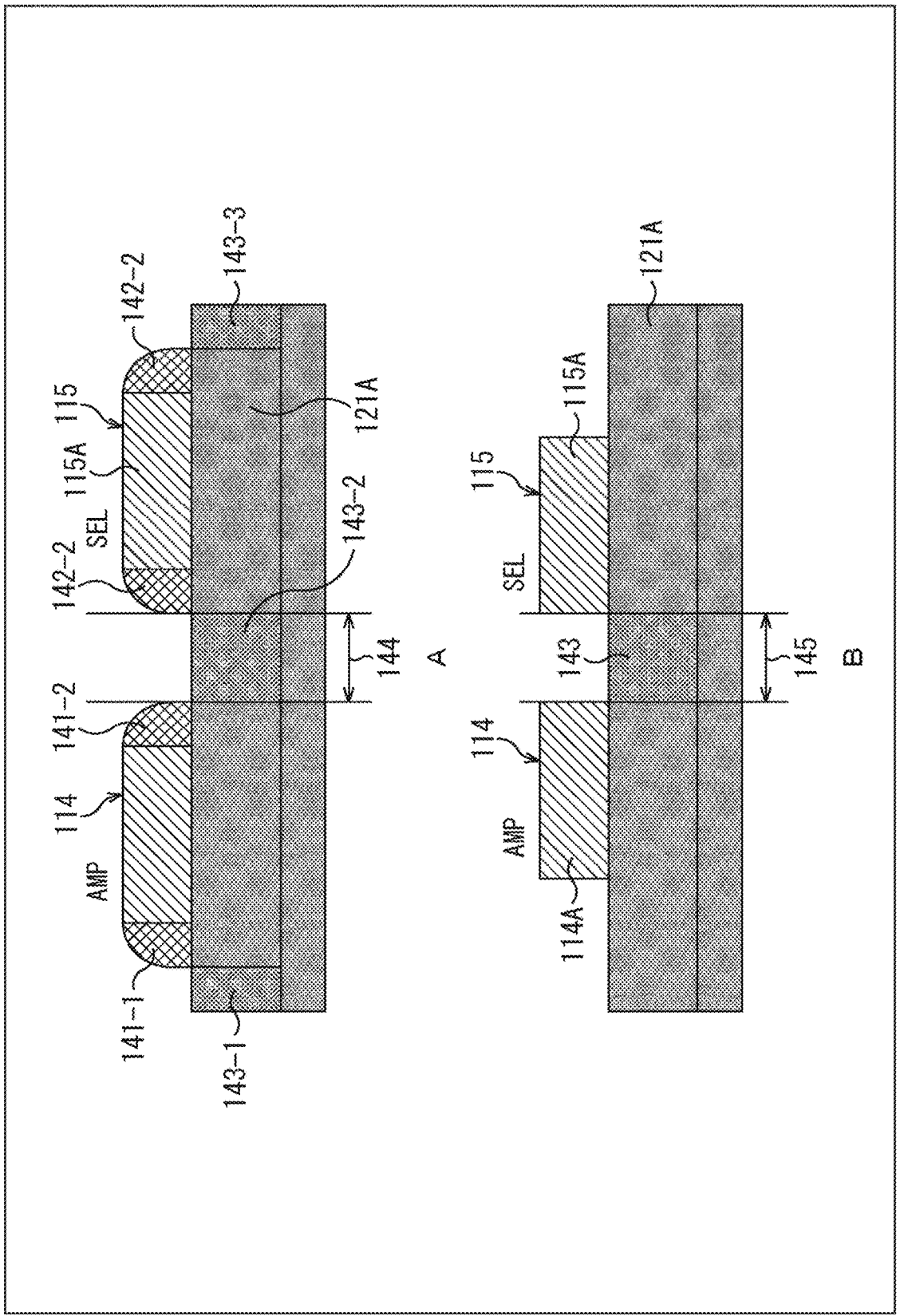
FIG. 4 depicts diagrams explaining a gate interval of the amplification transistor and the selection transistor.

For example, as indicated in a part A of FIG. 4, suppose that gate side walls 141 (gate side walls 141-1 and 141-2) are formed on the gate electrode 114A of the amplification transistor 114, and that gate side walls 142 (gate side walls 142-1 and 141-2) are formed on the gate electrode 115A of the selection transistor 115. After formation of these, a dopant may be injected into the silicon channel 121A. By injection of this dopant, an electrode 143-1 corresponding to the drain of the amplification transistor 114 is formed on the gate electrode 114A on the side opposite to the selection transistor 115. Moreover, an electrode 143-2 corresponding to the source of the amplification transistor 114 and the drain of the selection transistor 115 is formed between the gate electrode 114A and the gate electrode 115A. Furthermore, an electrode 143-3 corresponding to the source of the selection transistor 115 is provided on the gate electrode 115A on the side opposite to the amplification transistor 114. In a case where no distinction between the electrodes 143-1 to 143-3 is needed in the description, each of the electrodes 143-1 to 143-3 will be collectively referred to as an electrode 143.

In this case, it is sufficient if a length of the electrode 143-2 (an interval between the gate side wall 141-2 and the gate side wall 142-1) indicated by a double-headed arrow 144 is set to 100 nm or longer.

Specifically, for example, assuming that each width of the gate side wall 141-2 and the gate side wall 142-1 is set to 50 nm, it is sufficient if the distance between the amplification transistor 114 and the selection transistor 115 (gate electrode 114A and gate electrode 115A) is set to 200 nm or longer.

Moreover, for example, as depicted in a part B of FIG. 4, injection of the dopant into the silicon channel 121A for forming the electrodes 143 described above may be carried out before formation of the gate side wall 141 and the gate side wall 142. In this case, it is sufficient if the distance between the amplification transistor 114 and the selection transistor 115 (gate electrode 114A and gate electrode 115A) is set to 100 nm or longer.

3. Third Embodiment

<Manufacturing Device>

Manufacture of the imaging element 100 configured as above will be subsequently described. Described will be an example of manufacture of the imaging element 100 produced by injecting a dopant into the silicon channel 121A as described with reference to FIG. 3.

Figure 5:
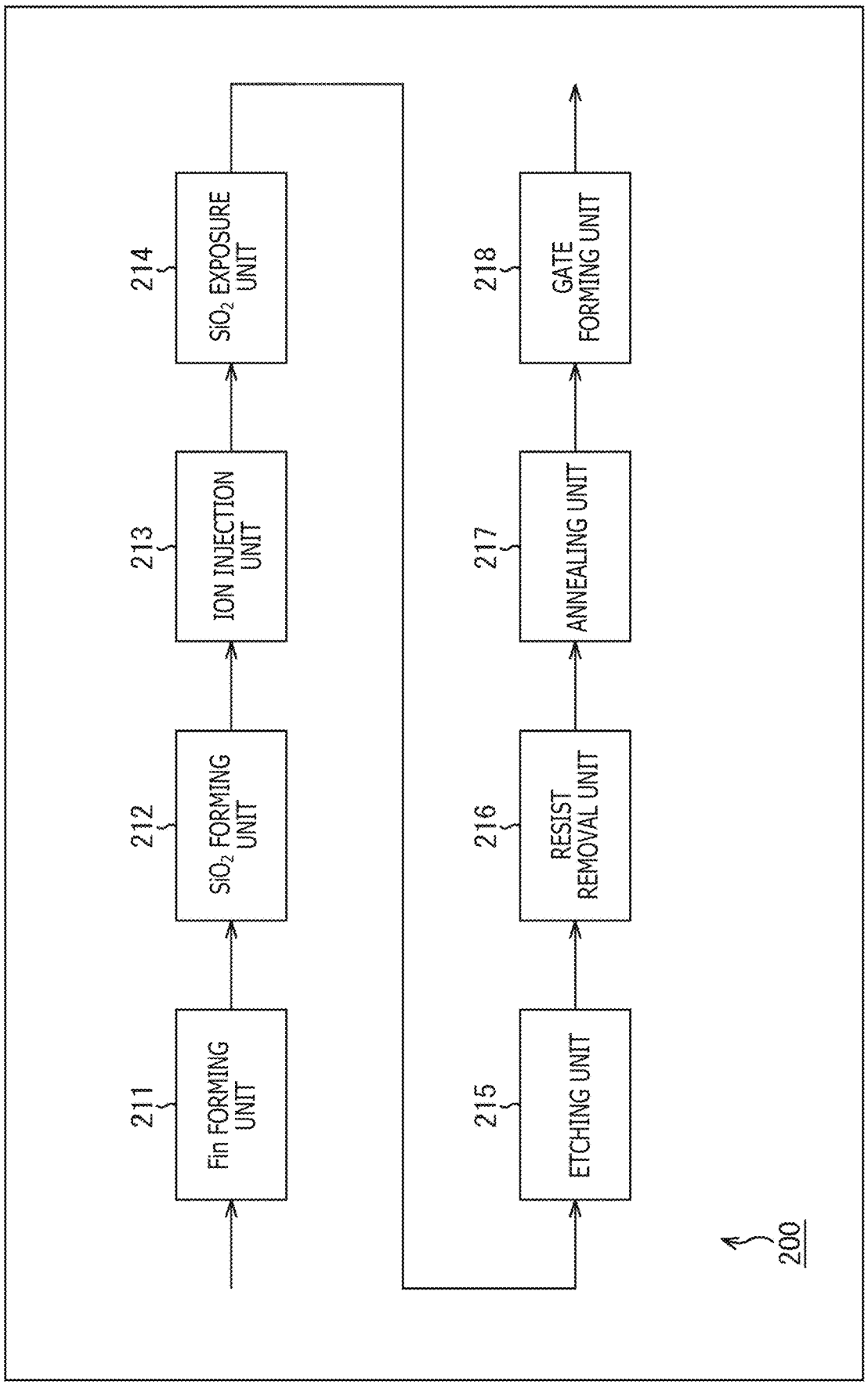
FIG. 5 is a block diagram depicting a main configuration example of a manufacturing device.

FIG. 5 is a block diagram depicting a main configuration example of a manufacturing device to which the present technology has been applied. A manufacturing device 200 manufactures (produces) the imaging element 100 in the example of FIG. 3. Note that only a part of steps for manufacturing the imaging element 100 will be hereinafter described.

As depicted in FIG. 5, the manufacturing device 200 includes a Fin forming unit 211, an SiO2 forming unit 212, an ion injection unit 213, an SiO2 exposure unit 214, an etching unit 215, a resist removal unit 216, an annealing unit 217, and a gate forming unit 218.

Figure 6:
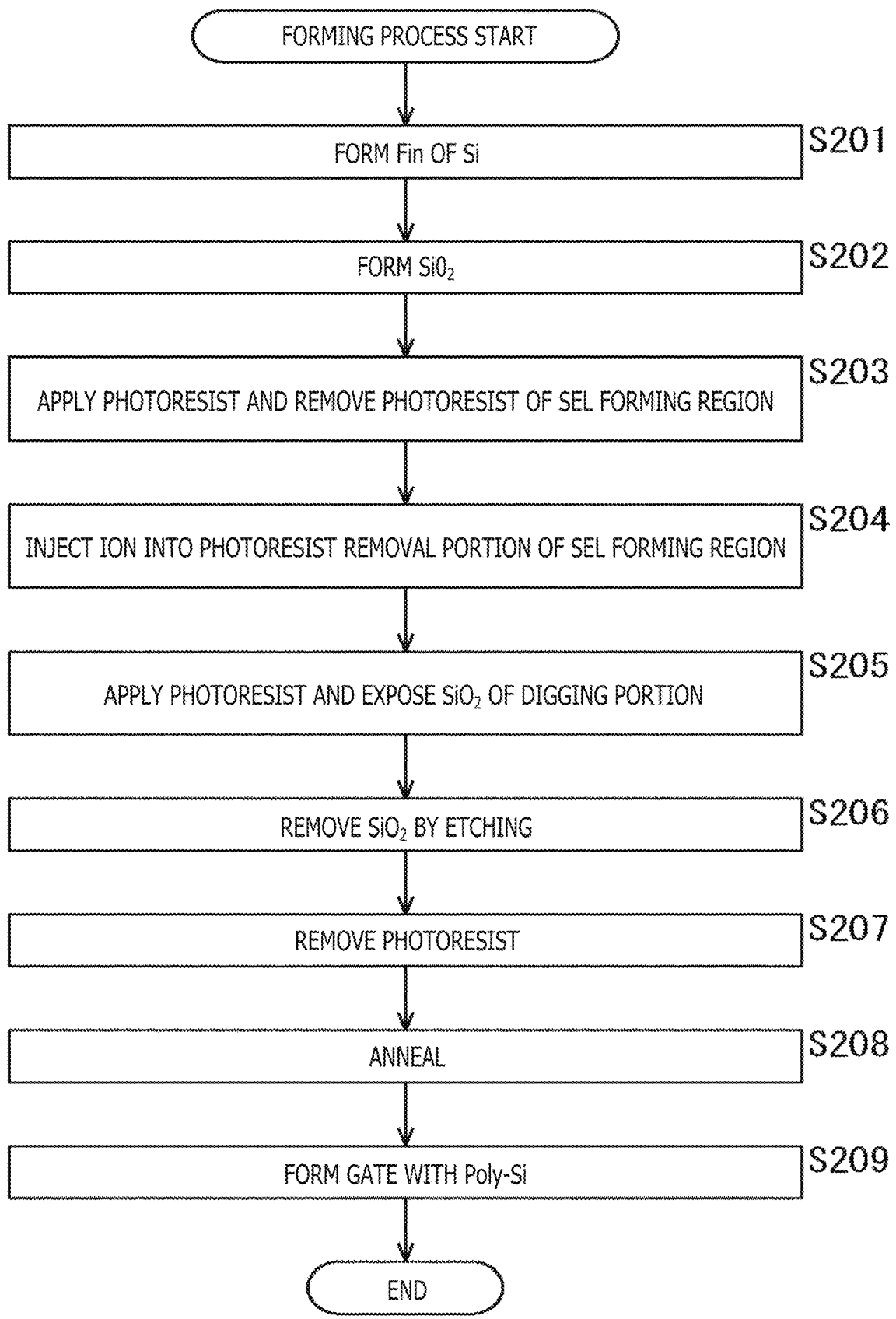
FIG. 6 is a flowchart explaining an example of a flow of a forming process.

Described with reference to a flowchart in FIG. 6 will be an example of a flow of a forming process executed by these processing units for forming the imaging element 100. This example will be described with reference to FIGS. 7 to 12 as necessary.

At a start of the forming process, the Fin forming unit 211 in step S201 acquires the silicon layer 121, forms the silicon channel 121A having a fin shape on the silicon layer 121, and supplies the silicon layer 121 thus obtained to the SiO2 forming unit 212.

In step S202, the SiO2 forming unit 212 acquires the silicon layer 121 supplied from the Fin forming unit 211 in the state where the silicon channel 121A having a fin shape is formed on the silicon layer 121. Moreover, the SiO2 forming unit 212 forms the insulation film 122 including SiO2 in each of separation regions of the silicon layer 121 on both sides of the silicon channel 121A. Furthermore, the SiO2 forming unit 212 supplies the silicon layer 121 to the ion injection unit 213 in the state where the insulation film 122 has been formed on the silicon layer 121.

Figure 7:
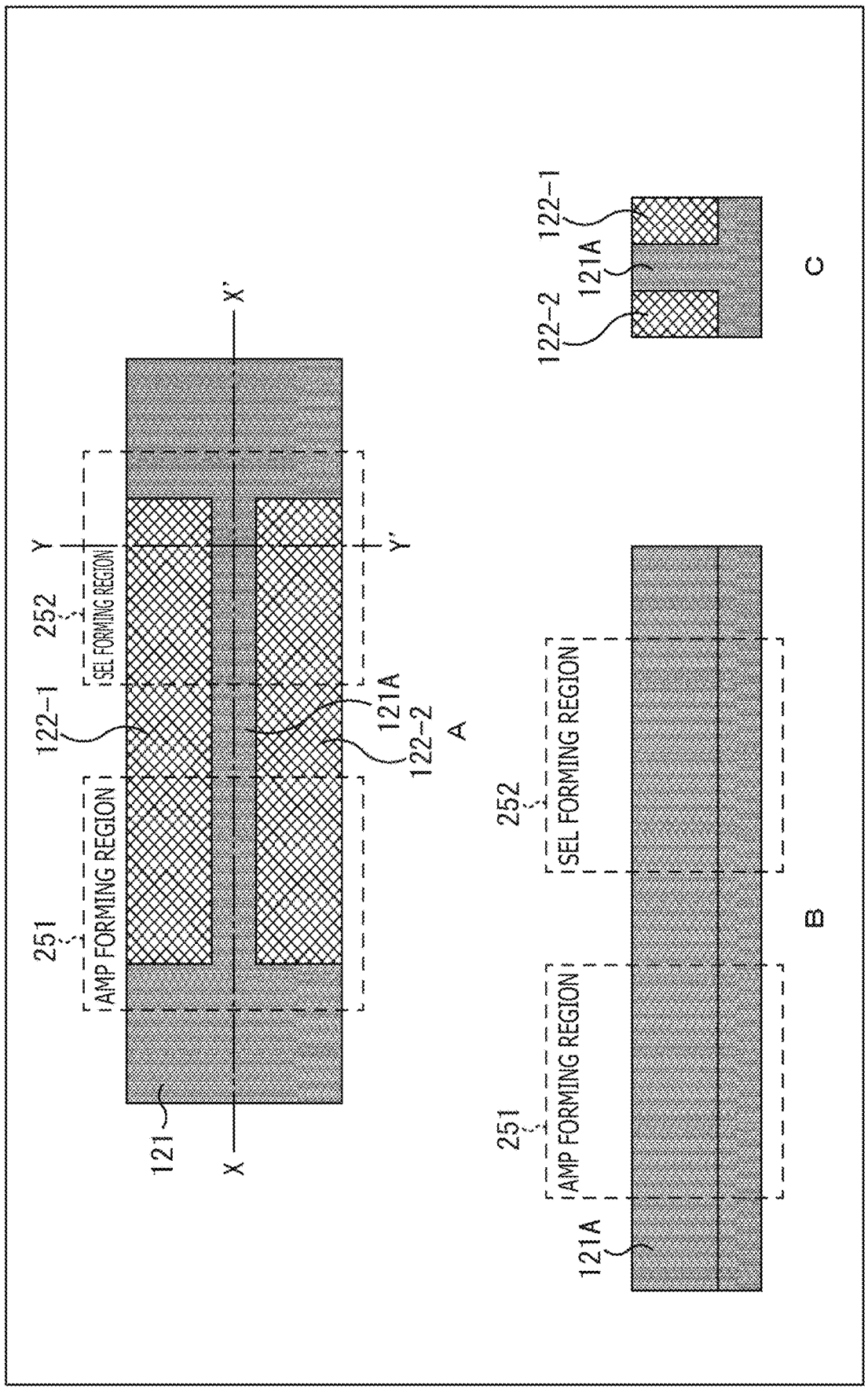
FIG. 7 depicts diagrams explaining an example state of formation of the amplification transistor and the selection transistor.

A part A of FIG. 7 is a plan diagram depicting a main configuration example of the silicon layer 121 on which the insulation film 122 is formed. In the part A of FIG. 7, an AMP forming region 251 is a region where the amplification transistor 114 is formed on the silicon layer 121 (silicon channel 121A). In addition, an SEL forming region 252 is a region where the selection transistor 115 is formed on the silicon layer 121 (silicon channel 121A).

A part B of FIG. 7 depicts an example of a cross-sectional diagram taken along one-dot chain line X-X' in the configuration depicted in the part A of FIG. 7. A part C of FIG. 7 depicts an example of a cross-sectional diagram taken along one-dot chain line Y-Y' in the configuration depicted in the part A of FIG. 7. As depicted in the part A of FIG. 7 and the part C of FIG. 7, the insulation films 122-1 and 122-2 are formed on one and the other sides of the silicon channel 121A having a fin shape, respectively.

In step S203, the ion injection unit 213 acquires the silicon layer 121 supplied from the SiO2 forming unit 212 in a state where the insulation film 122 has been formed on the silicon layer 121. Moreover, the ion injection unit 213 applies a photoresist on a surface of the silicon layer 121. Furthermore, the ion injection unit 213 removes a part of the photoresist corresponding to the SEL forming region 252 to form an opening.

Figure 8:
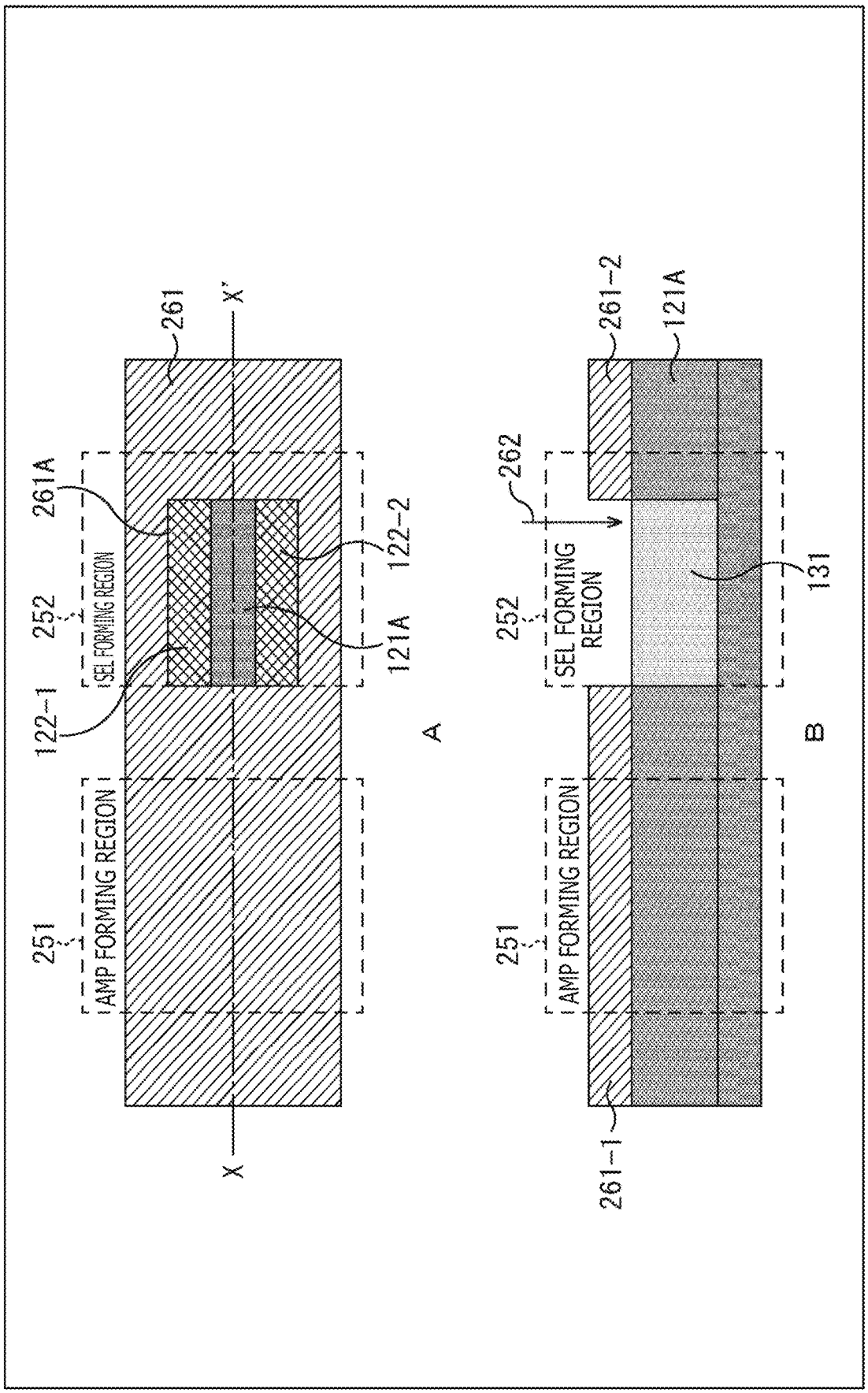
FIG. 8 depicts diagrams explaining an example state of formation of the amplification transistor and the selection transistor.

A part A of FIG. 8 is a plan diagram depicting a main configuration example of the silicon layer 121. As depicted in the part A of FIG. 8, a photoresist 261 is applied to the surface of the silicon layer 121. In addition, an opening 261A is formed by removing the photoresist 261 from a part of the SEL forming region 252. A part of each of the insulation films 122-1 and 122-2 (i.e., SiO2), and the silicon channel 121A is exposed through the opening 261A thus formed.

In step S204, the ion injection unit 213 injects a dopant (ion) into the silicon channel 121A exposed through the opening 261A. A part B of FIG. 8 depicts an example of a cross-sectional diagram taken along one-dot chain line X-X' in the configuration depicted in the part A of FIG. 8. As indicated by an arrow 262 in the part B of FIG. 8, the dopant (ion) is injected into the silicon channel 121A from the opening 261A to form the ion injection region 131.

In this manner, the threshold voltage Vth of the selection transistor 115 becomes controllable in the second embodiment as described above by injecting the ion as a dopant into the silicon channel 121A and forming the ion injection region 131. Moreover, for this injection, an ion having a smaller thermal diffusivity than each thermal diffusivity of boron (B) and phosphorous (P), for example, may be injected as a dopant. In this case, diffusion of the ion injection region 131 is avoidable. Accordingly, improvement of the off-characteristic of the selection transistor 115, and improvement of the modulation degree and the saturated charge amount of the selection transistor 115 are achievable while reducing deterioration of Vth controllability of the amplification transistor 114 and an increase in 1/f noise resulting from an increase in MOS interface electron density. In other words, image quality deterioration of a captured image can be reduced (typically, improvement of image quality can be achieved).

The ion injection unit 213 supplies the silicon layer 121 into which the ion has been injected to the SiO2 exposure unit 214.

In step S205, the SiO2 exposure unit 214 acquires the silicon layer 121 supplied from the ion injection unit 213. Moreover, the SiO2 exposure unit 214 newly applies a photoresist on the silicon layer 121. Furthermore, the SiO2 exposure unit 214 performs photolithography processing for the applied photoresist to expose SiO2 at a portion corresponding to digging. The SiO2 exposure unit 214 supplies the silicon layer 121 to the etching unit 215 in a state where the insulation film 122 in the AMP forming region 251 and the SEL forming region 252 is exposed as described above.

Figure 9:
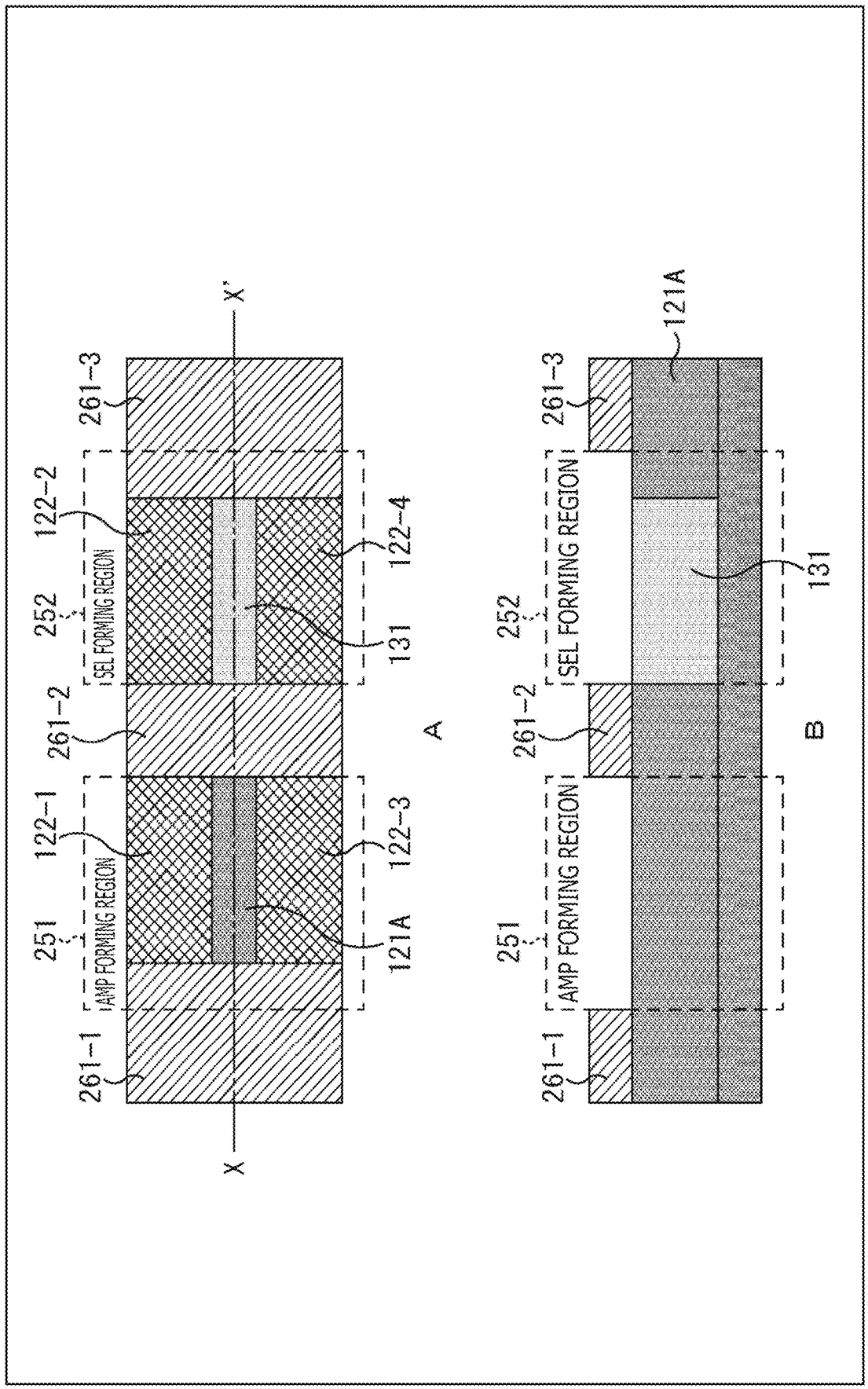
FIG. 9 depicts diagrams explaining an example state of formation of the amplification transistor and the selection transistor.

A part A of FIG. 9 is a plan diagram depicting a main configuration example of the silicon layer 121. As depicted in the part A of FIG. 9, the photoresist 261 in the AMP forming region 251 and the SEL forming region 252 is removed, and SiO2 is exposed (insulation films 122-1 to 122-4). A part B of FIG. 9 depicts an example of a cross-sectional diagram taken along one-dot chain line X-X' in the configuration depicted in the part A of FIG. 9.

In step S206, the etching unit 215 acquires the silicon layer 121 supplied from the SiO2 exposure unit 214. Moreover, the etching unit 215 etches the silicon layer 121 to remove SiO2 in the exposed portion. Furthermore, the etching unit 215 supplies the etched silicon layer 121 to the resist removal unit 216.

Figure 10:
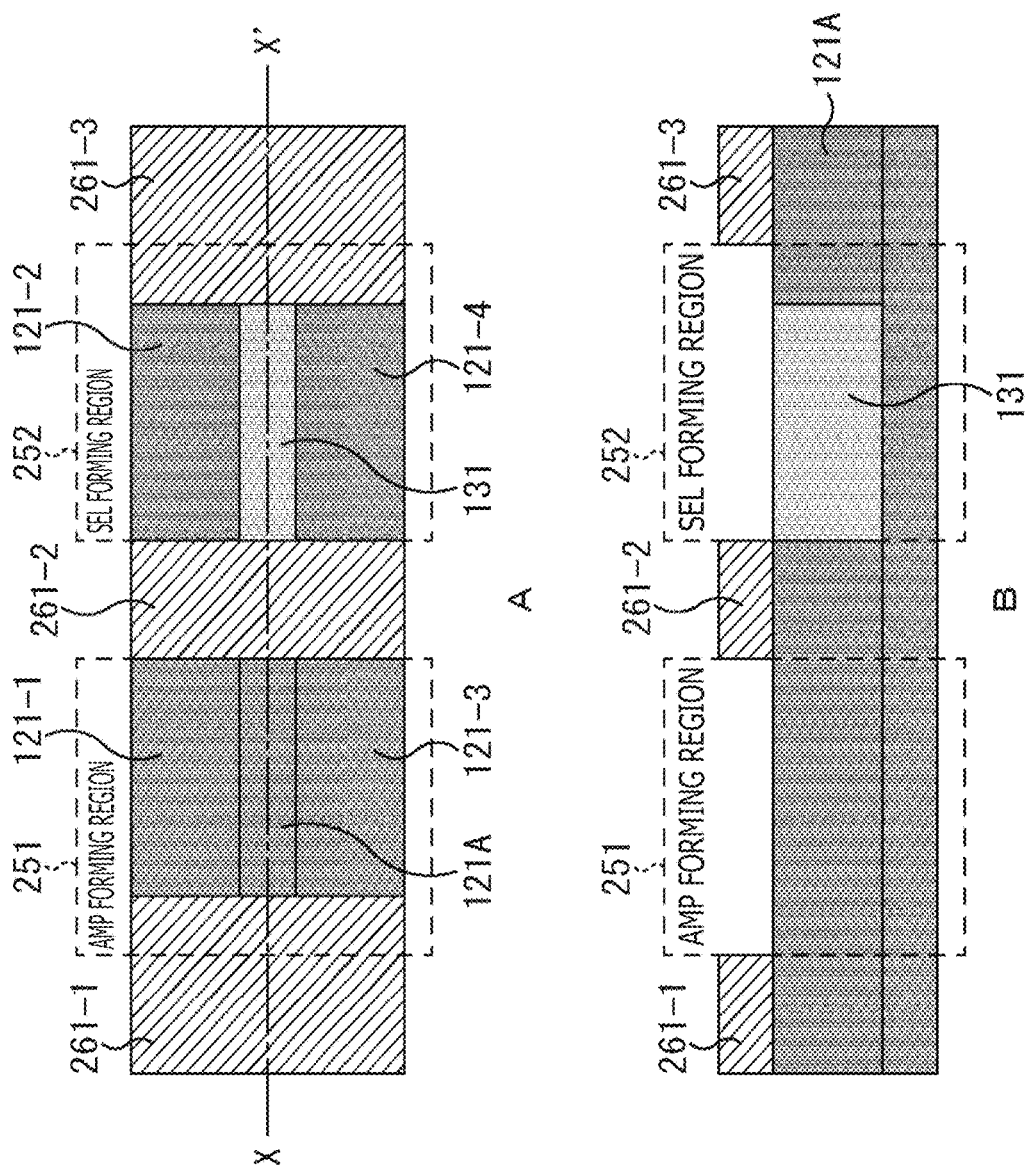
FIG. 10 depicts diagrams explaining an example state of formation of the amplification transistor and the selection transistor.

A part A of FIG. 10 is a plan diagram depicting a main configuration example of the silicon layer 121 in this state. As depicted in the part A of FIG. 10, the insulation film 122 (SiO2) in the AMP forming region 251 and the SEL forming region 252 is removed by etching. As a result, the silicon layer 121 is also exposed on both sides of the silicon channel 121A. A part B of FIG. 10 depicts an example of a cross-sectional diagram taken along one-dot chain line X-X' in the configuration depicted in the part A of FIG. 10.

In step S207, the resist removal unit 216 acquires the silicon layer 121 etched and supplied from the etching unit 215. Moreover, the resist removal unit 216 removes the photoresist 261 applied to the silicon layer 121. Furthermore, the resist removal unit 216 supplies the silicon layer 121 from which the photoresist has been removed to the annealing unit 217.

Figure 11:
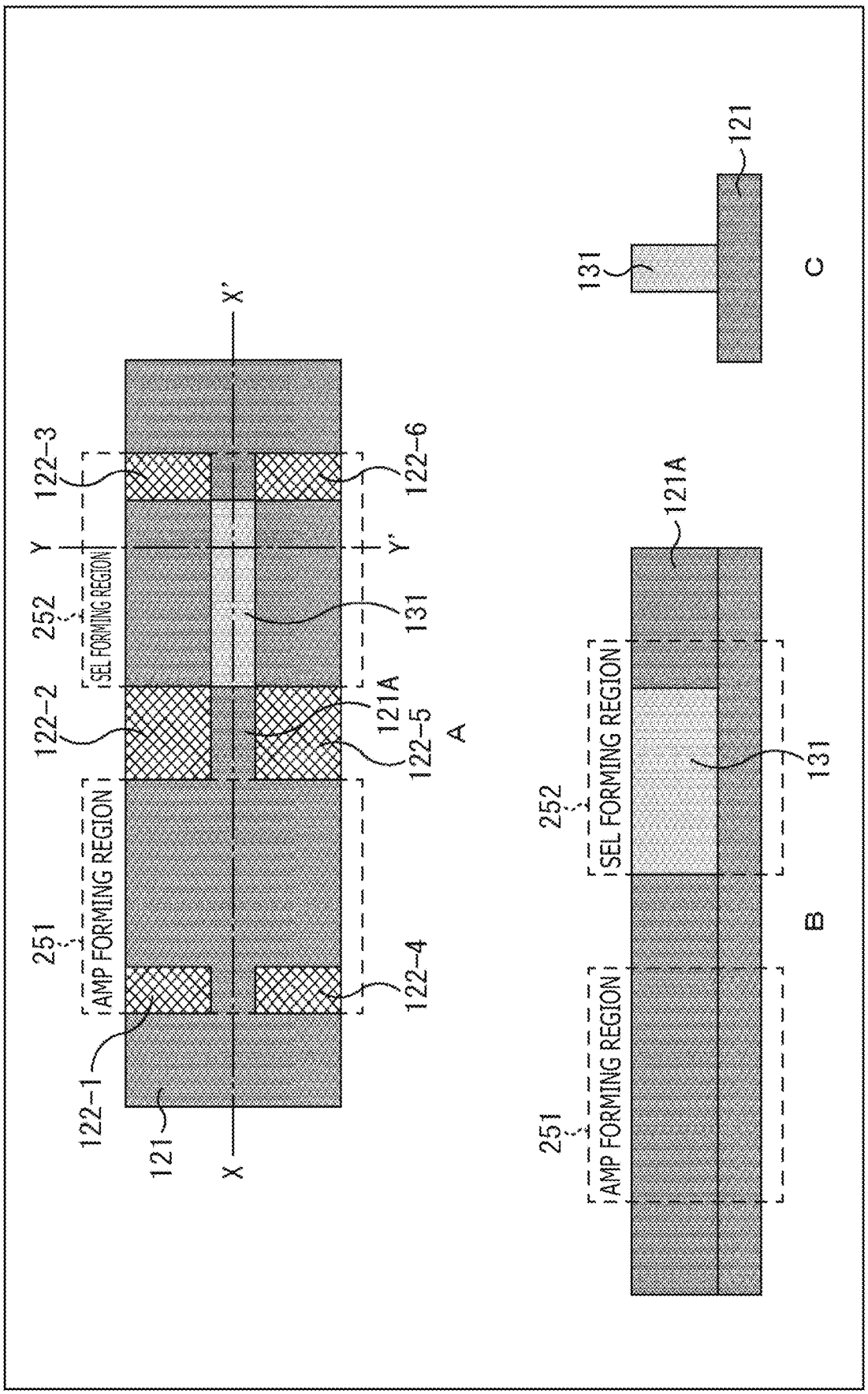
FIG. 11 depicts diagrams explaining an example state of formation of the amplification transistor and the selection transistor.

A part A of FIG. 11 is a plan diagram depicting a main configuration example of the silicon layer 121 in this state. As depicted in the part A of FIG. 11, photoresists 261-1 to 261-3 in the part A of FIG. 10 are removed, and the insulation films 122-1 to 122-6 are exposed. A part B of FIG. 11 depicts an example of a cross-sectional diagram taken along one-dot chain line X-X' in the configuration depicted in the part A of FIG. 11.

In step S208, the annealing unit 217 acquires the silicon layer 121 supplied from the resist removal unit 216 in a state where the photoresist has been removed. Moreover, the annealing unit 217 anneals the acquired silicon layer 121 at a predetermined temperature for a predetermined time to reduce interface state density, and removes a lattice defect produced in the side wall of the silicon channel 121A.

Figure 12:
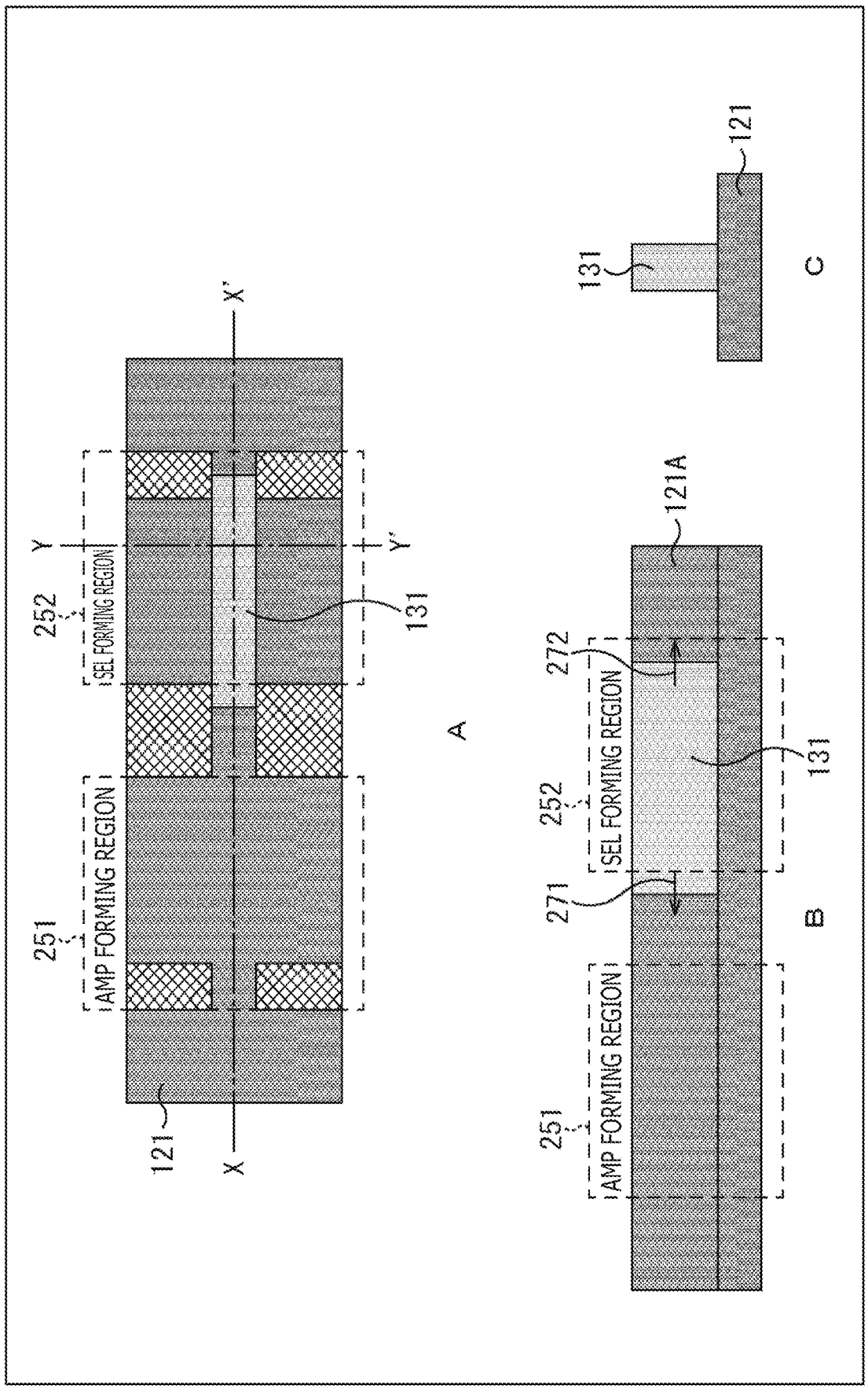
FIG. 12 depicts diagrams explaining an example state of formation of the amplification transistor and the selection transistor.

A part A of FIG. 12 is a plan diagram depicting a main configuration example of the silicon layer 121. A part B of FIG. 12 depicts an example of a cross-sectional diagram taken along one-dot chain line X-X' in the configuration depicted in the part A of FIG. 12. A part C of FIG. 12 depicts an example of a cross-sectional diagram taken along one-dot chain line Y-Y' in the configuration depicted in the part A of FIG. 12. The ion injection region 131 is expanded by this annealing (or any annealing performed in the following stage) in a manner indicated by arrows 271 and 272, for example, as depicted in the part B of FIG. 12. After completion of annealing, the annealing unit 217 supplies the annealed silicon layer 121 to the gate forming unit 218.

As described above, diffusion of the ion injection region 131 can be more reduced by using an ion having a smaller thermal diffusivity than a thermal diffusivity of each of boron (B) and phosphorous (P) as a dopant than in a case where boron (B) or phosphorous (P) is used as a dopant. Accordingly, an increase in the distance (a length of a double-headed arrow 132 in FIG. 3) required between the amplification transistor 114 and the selection transistor 115 (gate electrode 114A and gate electrode 115A) can be reduced. As a result, a size increase of the pixel unit can be more reduced.

In step S209, the gate forming unit 218 forms a gate electrode using polysilicon (Poly-Si) in such a manner as to cover the AMP forming region 251 and the SEL forming region 252 of the silicon channel 121A having a fin shape. As a result, the amplification transistor 114 and the selection transistor 115 configured as depicted in FIG. 3 (i.e., imaging element 100) are formed. In addition, the gate forming unit 218 outputs the imaging element 100 thus formed to the outside of the manufacturing device 200, and ends the forming process.

The manufacturing device 200 is capable of forming the imaging element 100 more easily by performing the forming process in the manner described above. In addition, for forming the imaging element 100 in the example of FIG. 2, it is sufficient if processing in steps S203 and S204 in FIG. 6 are eliminated.

4. Fourth Embodiment

<Work Function Control>

Note that a work function of the gate electrode may be controlled in place of injection of a dopant into the silicon channel 121A. Specifically, the threshold voltages Vth of the selection transistor 115 and the amplification transistor 114 may be controlled in accordance with selection of materials adopted for the gate electrode 115A of the selection transistor 115 and the gate electrode 114A of the amplification transistor 114.

For example, the Vth of the selection transistor 115 can be raised by using a material having a larger work function to constitute the gate electrode 115A. In this manner, improvement of the off-characteristic of the selection transistor 115 is achievable. In other words, image quality deterioration of a captured image can be reduced (typically, improvement of image quality can be achieved).

In addition, for example, the Vth of the selection transistor 115 can be lowered by using a material having a smaller work function to constitute the gate electrode 115A. In this manner, improvement of the modulation degree and the saturated charge volume of the selection transistor 115 is achievable. In other words, image quality deterioration of a captured image can be reduced (typically, improvement of image quality can be achieved).

Similarly, the threshold voltage Vth of the amplification transistor 114 is controllable in accordance with the material of the gate electrode 114A. Accordingly, image quality deterioration of a captured image can be reduced (typically, improvement of image quality can be achieved).

Figure 13:
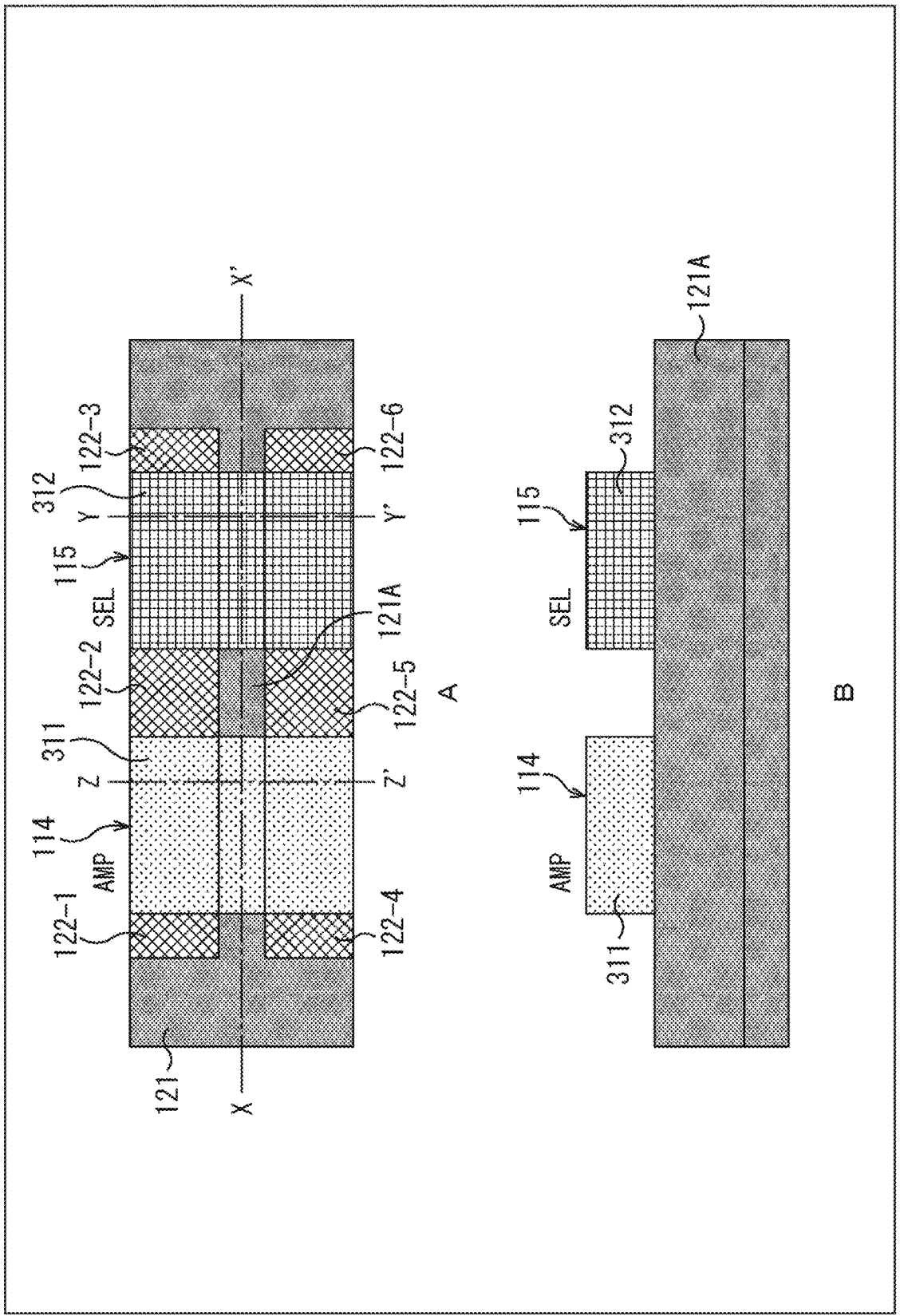
FIG. 13 depicts diagrams depicting another configuration example of the amplification transistor and the selection transistor.

For example, the gate electrodes of the selection transistor 115 and the amplification transistor 114 may include materials having work functions different from each other. A part A of FIG. 13 is a plan diagram depicting a main configuration example of the amplification transistor 114 and the selection transistor 115 in this case. In a case of the example depicted in the part A of FIG. 13, the gate electrode 311 of the amplification transistor 114 is constituted by an N-type semiconductor, and has a low value of the threshold voltage Vth. Meanwhile, the gate electrode 312 of the selection transistor 115 is constituted by a P-type semiconductor, and has a high value of the threshold voltage Vth.

Figure 14:
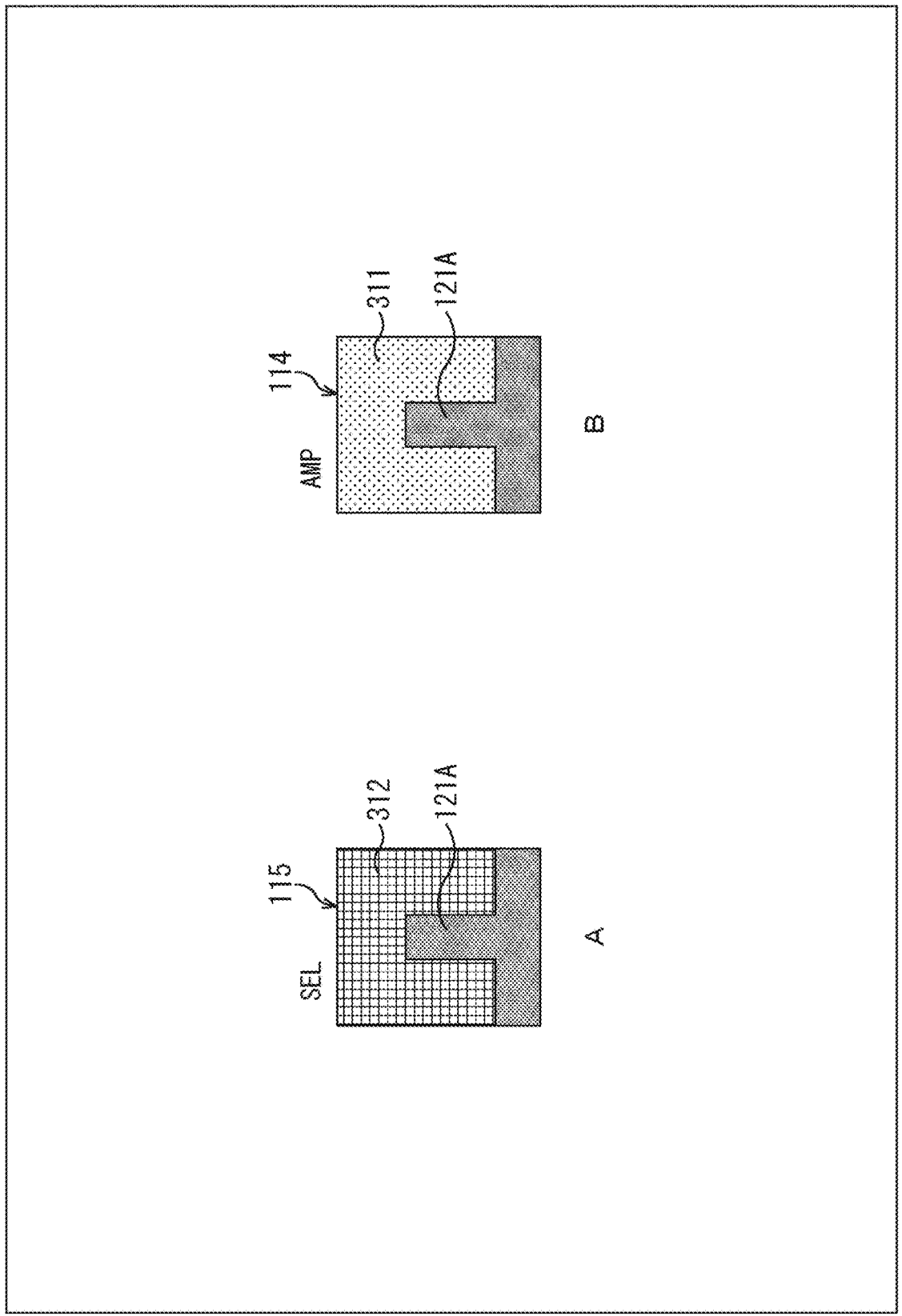
FIG. 14 depicts diagrams depicting the other configuration example of the amplification transistor and the selection transistor.

A part B of FIG. 13 depicts an example of a cross-sectional diagram taken along one-dot chain line X-X' in the configuration depicted in the part A of FIG. 13. Moreover, a part A of FIG. 14 depicts an example of a cross-sectional diagram taken along one-dot chain line Y-Y' in the configuration depicted in the part A of FIG. 13. Furthermore, a part B of FIG. 14 depicts an example of a cross-sectional diagram taken along one-dot chain line Z-Z' in the configuration depicted in the part A of FIG. 13.

As depicted in these figures, in the case depicted herein, only the gate electrode 114A and the gate electrode 115A are formed on the silicon channel 121A of the amplification transistor 114 and the selection transistor 115 in such a manner as to cover the silicon channel 121A. In this case, no dopant is injected. Accordingly, the ion injection region 131 is not diffused by annealing or the like. As a result, the distance between the amplification transistor 114 and the selection transistor can be made shorter than that distance in the second embodiment. In this manner, an increase in the size of the pixel unit can be reduced (typically, miniaturization of the pixel unit can be more facilitated).

Figure 16:
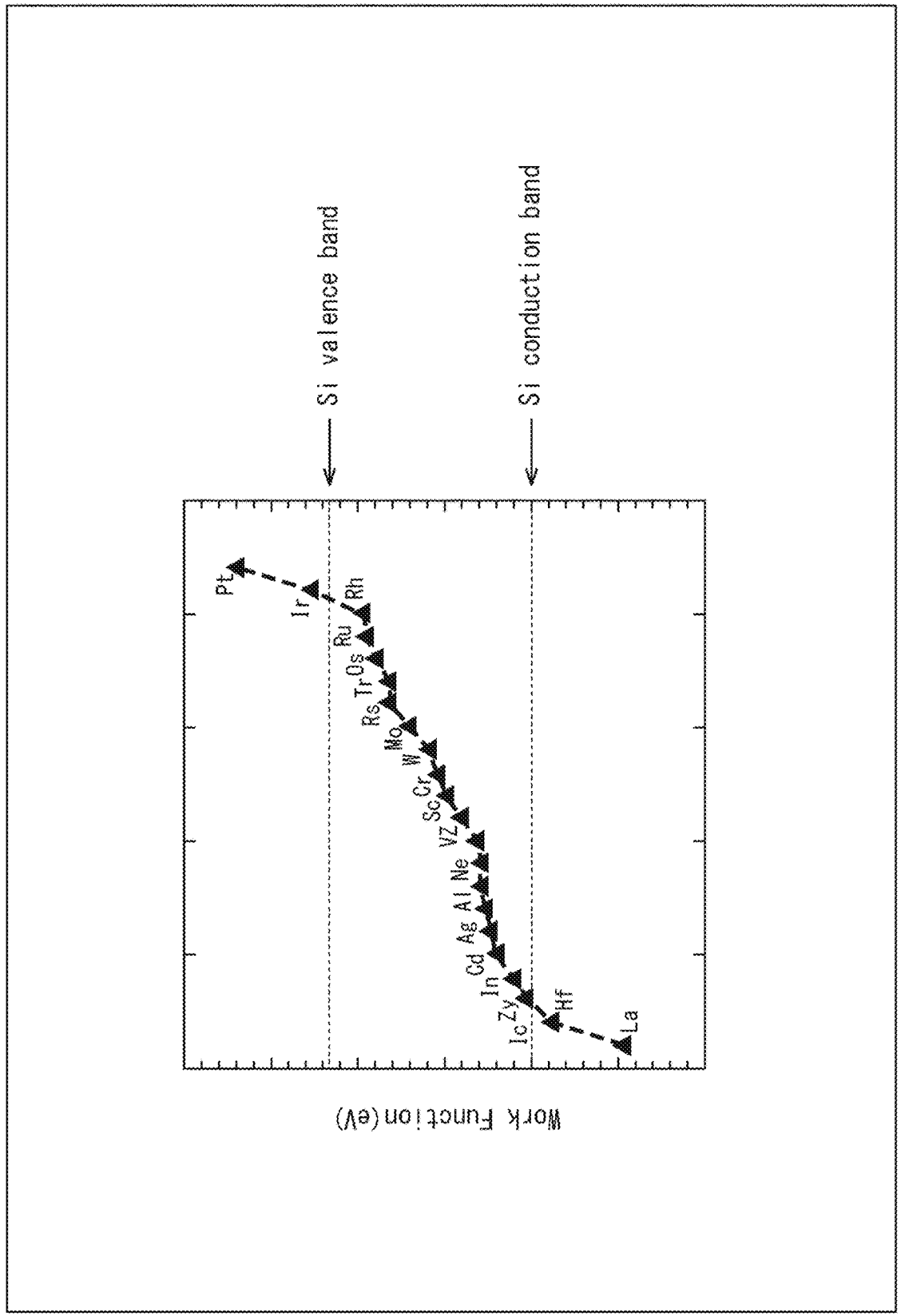
FIG. 16 is a diagram presenting an example of work functions of main elements.

For example, as presented in a periodic table of elements in FIG. 15, for example, the work function increases with nearness to the right side of the periodic table of elements. For example, each of the gate electrode 311 and the gate electrode 312 may include metal to constitute a metal gate. A graph in FIG. 16 is a diagram presenting an example of work functions of various types of metal. As presented in the graph in FIG. 16, work functions of various types of metal differ for each type.

Accordingly, the work functions of the gate electrode 311 and the gate electrode 312 are controllable in accordance with selection of metal adopted for the gate electrode 311 and the gate electrode 312. For example, the gate electrode 312 of the selection transistor 115 includes a material such as tungsten (W), ruthenium (Ru), or rhodium (Rh), while the gate electrode 311 of the amplification transistor 114 includes an N-type semiconductor. In this case, the threshold voltage Vth of the selection transistor 115 can be set higher than the threshold voltage Vth of the amplification transistor 114.

Needless to say, the materials of the gate electrode 311 and the gate electrode 312 are switchable to each other. By inversely using these materials of the example described above, an inverse relationship of the threshold voltage Vth between the amplification transistor 114 and the selection transistor 115 can be set with respect to the relationship in the example described above.

Figure 17:
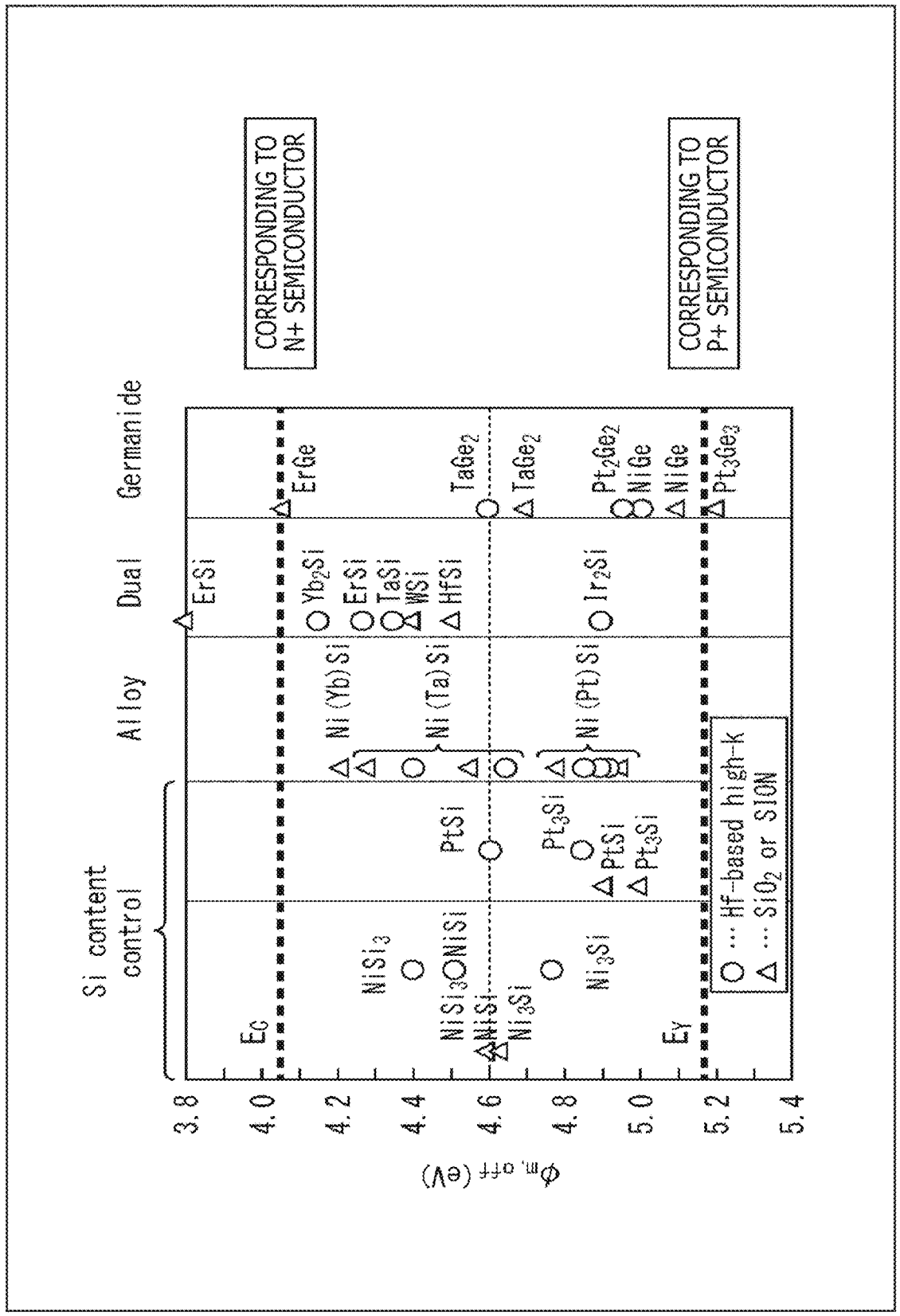
FIG. 17 is a diagram presenting an example of work functions of main silicide.

Moreover, each of the gate electrode 311 and the gate electrode 312 may be constituted by a compound of metal and silicon (silicide). FIG. 17 depicts examples of work functions of silicide. Similarly to the case of metal, each of the threshold voltages Vth of the amplification transistor 114 and the selection transistor 115 can be set further higher by using a silicide having a larger work function in various types of silicide depicted in FIG. 17. Moreover, each of the threshold voltages Vth of the amplification transistor 114 and the selection transistor 115 can be set further lower by using a silicide having a smaller work function.

5. Application Examples

<Configuration Application>

Figure 18:
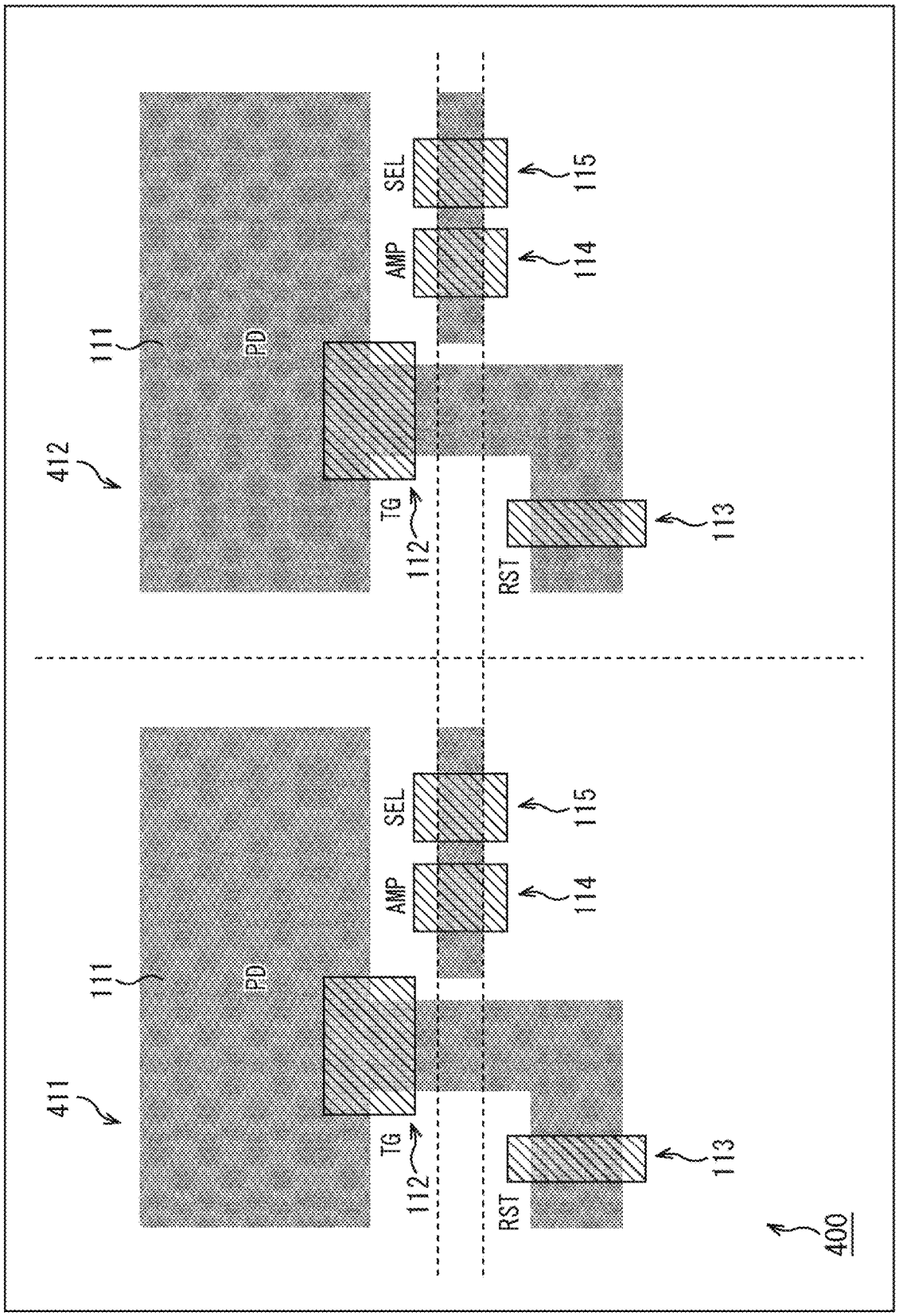
FIG. 18 is a plan diagram depicting a main configuration example of a pixel unit of an imaging element.

Application examples of the present technology described above will be subsequently described. Instead of the configuration example of the pixel unit depicted in FIG. 1, adoptable is an imaging element 400 depicted in FIG. 18 and configured such that the respective positions of the transfer transistors 112 to the selection transistor 115 in the vertical direction in the figure (positions in a column direction in a pixel array, i.e., row) in a pixel may be identical to those positions of a pixel arranged next to the foregoing pixel in the horizontal direction (row direction) in the figure in the pixel array. FIG. 18 depicts a configuration example of two pixel units (pixel units 411 and 412) adjacent to each other in the row direction of the pixel array. As indicated by dotted lines in FIG. 18, the amplification transistor 114 and the selection transistor 115 of the pixel unit 411, and the amplification transistor 114 and the selection transistor 115 of the pixel unit 412 are disposed in an identical row (an identical position in the vertical direction in the figure). Note that an element separation region or the like for separating the pixel units from other pixel units, for example, may be formed in a white region between the pixel units in the figure. For example, the element separation region is constituted by an insulation film such as LOCOS and STI. In a case of electronic readout, the element separation region may also be constituted by a p-type region.

Moreover, as in the example depicted in FIG. 18, the transfer transistor 112 and the reset transistor 113 may be disposed in rows (positions in the vertical direction in the figure) different from the row where the amplification transistor 114 and the selection transistor 115 are disposed.

In this manner, simplification of the layout of control lines and the like is achievable. Accordingly, an increase in the scale of the pixel array can be more easily reduced (typically, the pixel array can be more miniaturized) by applying the present technology to this layout.

Moreover, while the single photodiode 111 is provided in the example depicted in FIGS. 1 and 8 presented as the configuration example of the pixel unit, a plurality of the photodiodes 111 may be provided to constitute one pixel unit. Specifically, what is called a pixel sharing structure may be adopted to allow the amplification transistor 114 and the selection transistor 115 to amplify charge of the plurality of photodiodes 111, or control output of the charge to the signal lines.

Furthermore, while the example of the multigate transistor constituted by a FinFET has been presented to describe the present technology, each of the amplification transistor 114 and the selection transistor 115 may be a multigate transistor other than a FinFET, such as a tri-gate transistor and an all-round gate FET.

<Application to Imaging Device>

Figure 19:
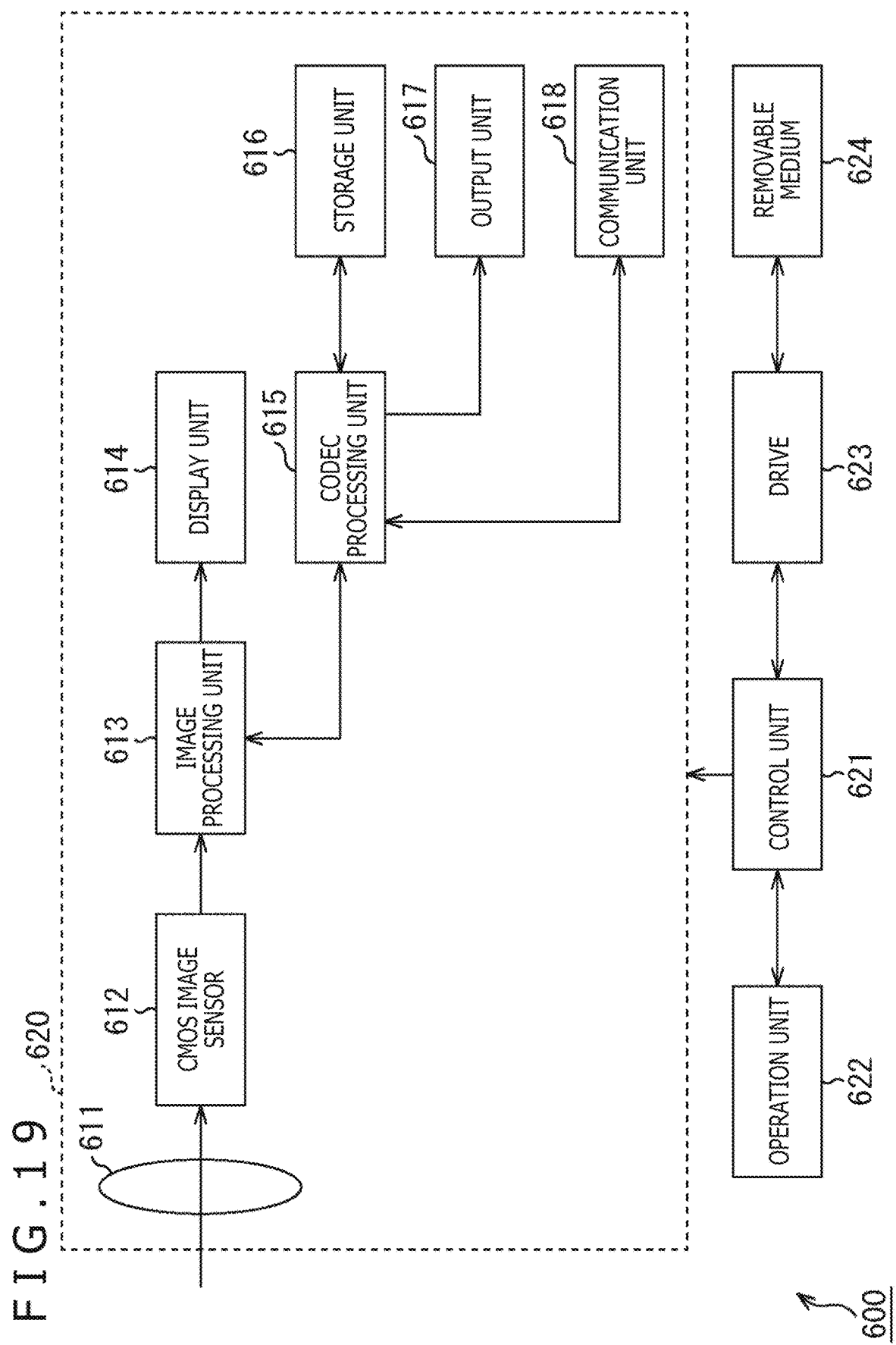
FIG. 19 is a block diagram depicting a main configuration example of an imaging device.

Note that the present technology is applicable to others as well as the imaging element. For example, the present technology may be applied to a device including the imaging element (electronic apparatus or the like), such as an imaging device. FIG. 19 is a block diagram depicting a main configuration example of an imaging device as an electronic apparatus to which the present technology has been applied. An imaging device 600 depicted in FIG. 19 is a device which captures an image of an object, and outputs the image of the object as an electric signal.

As depicted in FIG. 19, the imaging device 600 includes an optical unit 611, a CMOS (Complementary Metal Oxide Semiconductor) image sensor 612, an image processing unit 613, a display unit 614, a codec processing unit 615, a storage unit 616, an output unit 617, a communication unit 618, a control unit 621, an operation unit 622, and a drive 623.

The optical unit 611 adjusts a focus until an object, and is constituted by a lens for condensing light coming from a position in focus, a diaphragm for adjusting exposure, a shutter for controlling timing of imaging, and the like. The optical unit 611 transmits light (incident light) from the object, and supplies the light to the CMOS image sensor 612.

The CMOS image sensor 612 photoelectrically converts incident light, achieves A/D conversion of a signal of each pixel (pixel signal), performs signal processing such as CDS, and supplies captured image data obtained by signal processing to the image processing unit 613.

The image processing unit 613 performs image processing for captured image data obtained by the CMOS image sensor 612. More specifically, the image processing unit 613 performs various types of image processing, such as color mixture correction, black level correction, white balance adjustment, demosaic processing, matrix processing, gamma correction, and YC conversion, for the captured image data supplied from the CMOS image sensor 612. The image processing unit 613 supplies the captured image data obtained by image processing to the display unit 614.

For example, the display unit 614 is constituted by a liquid crystal display or the like, and displays an image of captured image data supplied from the image processing unit 613 (e.g., an image of an object).

The image processing unit 613 further supplies captured image data obtained by image processing to the codec processing unit 615 as necessary.

The codec processing unit 615 performs a coding process in a predetermined form for captured image data supplied from the image processing unit 613, and supplies coded data thus obtained to the storage unit 616. Moreover, the codec processing unit 615 reads coded data recorded in the storage unit 616, decodes the coded data to generate decoded image data, and supplies the decoded image data to the image processing unit 613.

The image processing unit 613 performs predetermined image processing for decoded image data supplied from the codec processing unit 615. The image processing unit 613 supplies decoded image data obtained by image processing to the display unit 614. For example, the display unit 614 is constituted by a liquid crystal display or the like, and displays an image of decoded image data supplied from the image processing unit 613.

Moreover, the codec processing unit 615 may supply, to the output unit 617, coded data obtained by coding captured image data supplied from the image processing unit 613, or coded data of captured image data read from the storage unit 616, and cause the output unit 617 to output the supplied coded data to the outside of the imaging device 600. Furthermore, the codec processing unit 615 may supply, to the output unit 617, captured image data before coding, or decoded image data obtained by decoding coded data read from the storage unit 616, and cause the output unit 617 to output the supplied data to the outside of the imaging device 600.

Besides, the codec processing unit 615 may transfer captured image data, coded data of captured image data, or decoded image data to another device via the communication unit 618. Moreover, the codec processing unit 615 may acquire captured image data or coded data of image data via the communication unit 618. The codec processing unit 615 performs coding, decoding or the like for captured image data or coded data of image data acquired via the communication unit 618 as necessary. The codec processing unit 615 may supply obtained image data or coded data to the image processing unit 613, cause the storage unit 616 to store the image data or coded data, or cause the output unit 617 and the communication unit 618 to output the image data or coded data as described above.

The storage unit 616 stores coded data or the like supplied from the codec processing unit 615. The coded data stored in the storage unit 616 is read and decoded by the codec processing unit 615 as necessary. The captured image data obtained by the decoding process is supplied to the display unit 614, and a captured image corresponding to the captured image data is displayed.

The output unit 617 has an external output interface such as an external output terminal, and outputs various types of data supplied via the codec processing unit 615 to the outside of the imaging device 600 via the external output interface.

The communication unit 618 supplies various types of information such as image data and coded data supplied from the codec processing unit 615 to another device which is a communication partner of predetermined communication (wired communication or wireless communication). Moreover, the communication unit 618 acquires various types of information such as image data and coded data from another device which is a communication partner of predetermined communication (wired communication or wireless communication), and supplies the acquired information to the codec processing unit 615.

The control unit 621 has a predetermined digital circuit and the like, and performs processing associated with control of operations of respective processing units (respective processing units depicted within a dotted line 620, an operation unit 622, and a drive 623) of the imaging device 600. Note that the control unit 621 may have a CPU, a ROM, a RAM, and the like, for example, and cause the CPU to perform various types of processing associated with the foregoing control by executing programs and data loaded from the ROM or the like to the RAM.

The operation unit 622 constituted by any input device such as a jog dial (trademark), keys, buttons, and a touch panel, for example, receives an operation input from a user or the like, and supplies a signal corresponding to the operation input to the control unit 621.

The drive 623 reads information stored in a removable medium 624 attached to the drive 623 itself, such as a magnetic disk, an optical disk, a magneto-optical disk, and a semiconductor memory. The drive 623 reads various types of information such as programs and data from the removable medium 624, and supplies the read information to the control unit 621. Moreover, in a case where the removable medium 624 of a writable type is attached to the drive 623, the drive 623 causes the removable medium 624 to store various types of information such as image data and coded data supplied via the control unit 621.

The present technology described in each of the embodiments is applied to the CMOS image sensor 612 of the imaging device 600 configured as above. Specifically, the imaging element 100 or the imaging element 400 described above is used as the CMOS image sensor 612. In this case, the CMOS image sensor 612 is capable of reducing image quality deterioration of a captured image. Accordingly, the imaging device 600 is capable of obtaining higher-quality captured image by imaging an object.

<Application to Software>

A series of processes described above may be executed either by hardware or by software. In a case where the series of processes are executed by software, a program constituting the software is installed in a computer. Examples of the computer herein include a computer incorporated in dedicated hardware, and a computer capable of executing various functions under various programs installed in the computer, such as a general-purpose personal computer.

Figure 20:
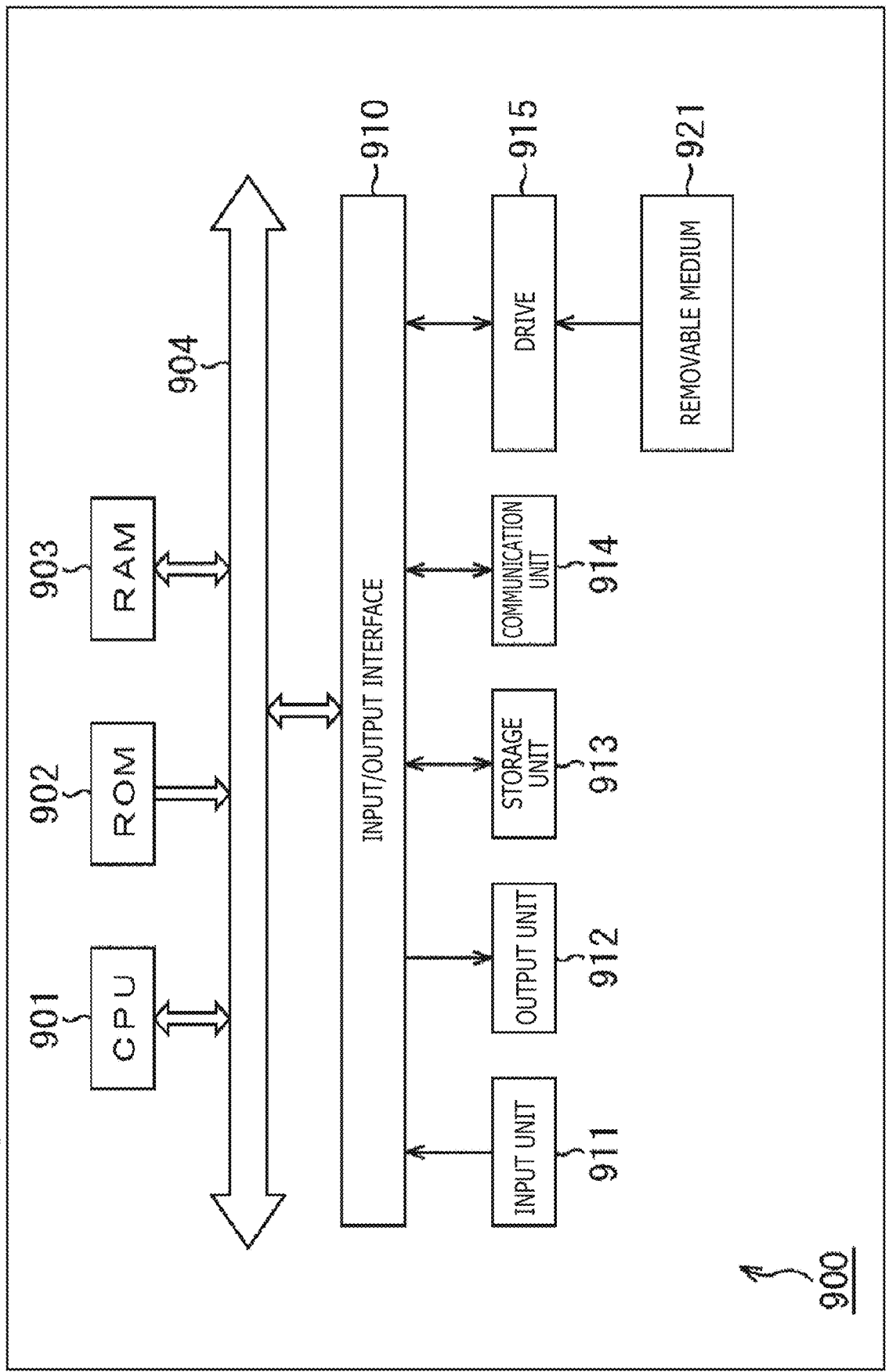
FIG. 20 is a block diagram depicting a main configuration example of a computer.

FIG. 20 is a block diagram depicting a hardware configuration example of a computer which executes the series of processes described above under a program.

A computer 900 depicted in FIG. 20 includes a CPU (Central Processing Unit) 901, a ROM (Read Only Memory) 902, and a RAM (Random Access Memory) 903 connected to each other via a bus 904.

An input/output interface 910 is further connected to the bus 904. An input unit 911, an output unit 912, a storage unit 913, a communication unit 914, and a drive 915 are connected to the input/output interface 910.

For example, the input unit 911 is constituted by a keyboard, a mouse, a microphone, a touch panel, an input terminal, and others. For example, the output unit 912 is constituted by a display, a speaker, an output terminal, and others. For example, the storage unit 913 is constituted by a hard disk, a RAM disk, a non-volatile memory, and others. For example, the communication unit 914 is constituted by a network interface and others. The drive 915 drives a removable medium 921 such as a magnetic disk, an optical disk, a magneto-optical disk, and a semiconductor memory.

According to the computer configured as described above, for example, the CPU 901 loads a program stored in the storage unit 913 into the RAM 903 via the input/output interface 910 and the bus 904, and executes the loaded program to perform the series of processes described above. Data and the like required when the CPU 901 executes various processes are also stored in the RAM 903 as necessary.

For example, the program executed by the computer (CPU 901) is allowed to be recorded in the removable medium 921 as a package medium or the like, and provided in this form. In this case, the program is allowed to be installed into the storage unit 913 via the input/output interface 910 from the removable medium 921 attached to the drive 915.

Moreover, the program is allowed to be provided via a wired or wireless transfer medium such as a local area network, the Internet, and digital satellite broadcasting. In this case, the program is allowed to be received by the communication unit 914, and installed into the storage unit 913.

Furthermore, the program is allowed to be installed in the ROM 902 or the storage unit 913 beforehand.

6. Exemplary Application to Mobile Body

The technology (present technology) according to the present disclosure can be applied to various products. For example, the technology according to the present disclosure may be implemented as an apparatus to be mounted on any type of mobile body such as a motor vehicle, an electric vehicle, a hybrid electric vehicle, a motorcycle, a bicycle, a personal mobility, an airplane, a drone, a ship, a robot, or any other mobile body.

Figure 21:
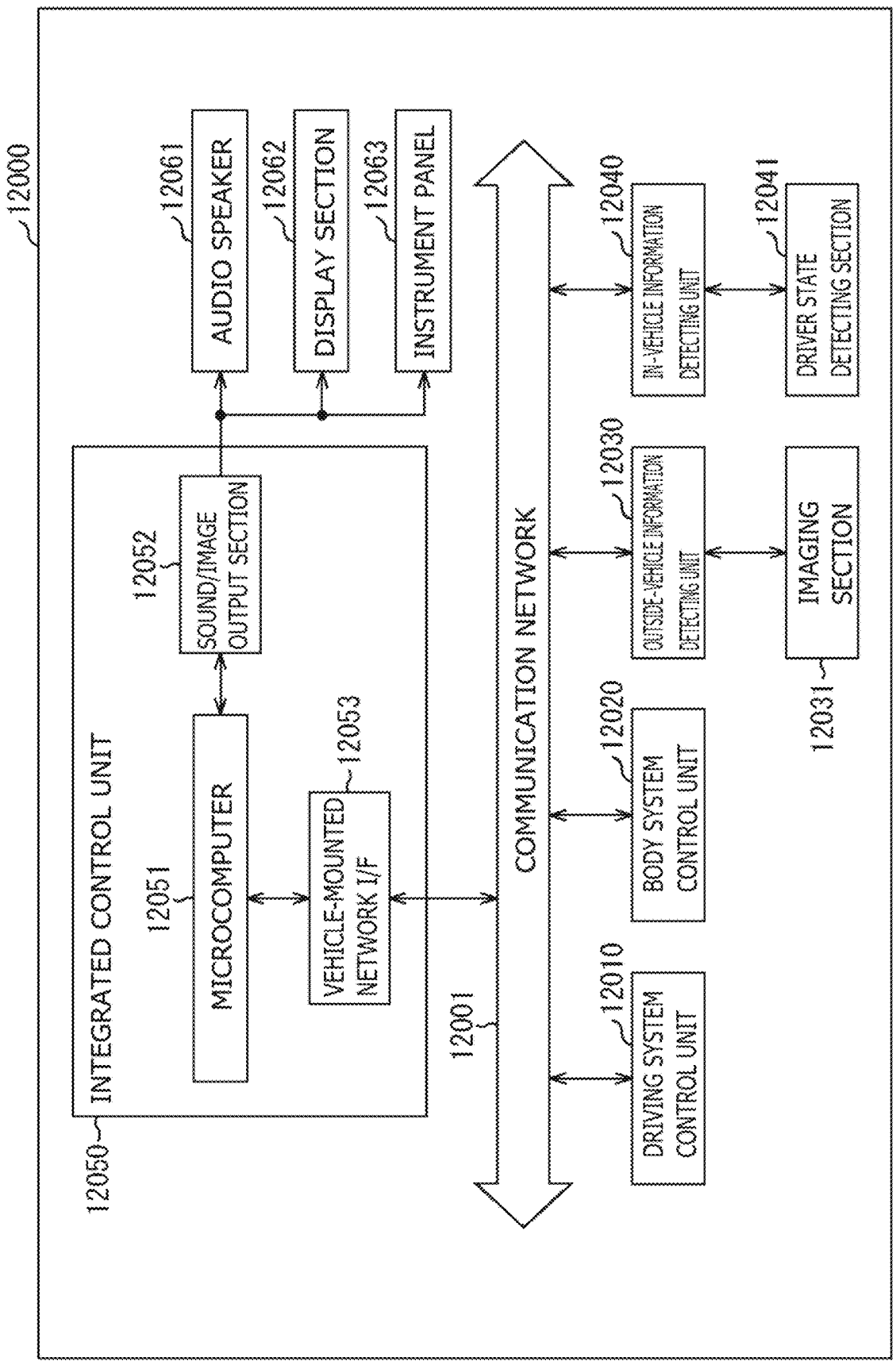
FIG. 21 is a block diagram depicting an example of schematic configuration of a vehicle control system.

FIG. 21 is a block diagram depicting an example of schematic configuration of a vehicle control system as an example of a mobile body control system to which the technology according to an embodiment of the present disclosure can be applied.

The vehicle control system 12000 includes a plurality of electronic control units connected to each other via a communication network 12001. In the example depicted in FIG. 21, the vehicle control system 12000 includes a driving system control unit 12010, a body system control unit 12020, an outside-vehicle information detecting unit 12030, an in-vehicle information detecting unit 12040, and an integrated control unit 12050. In addition, a microcomputer 12051, a sound/image output section 12052, and a vehicle-mounted network interface (I/F) 12053 are illustrated as a functional configuration of the integrated control unit 12050.

The driving system control unit 12010 controls the operation of devices related to the driving system of the vehicle in accordance with various kinds of programs. For example, the driving system control unit 12010 functions as a control device for a driving force generating device for generating the driving force of the vehicle, such as an internal combustion engine, a driving motor, or the like, a driving force transmitting mechanism for transmitting the driving force to wheels, a steering mechanism for adjusting the steering angle of the vehicle, a braking device for generating the braking force of the vehicle, and the like.

The body system control unit 12020 controls the operation of various kinds of devices provided to a vehicle body in accordance with various kinds of programs. For example, the body system control unit 12020 functions as a control device for a keyless entry system, a smart key system, a power window device, or various kinds of lamps such as a headlamp, a backup lamp, a brake lamp, a turn signal, a fog lamp, or the like. In this case, radio waves transmitted from a mobile device as an alternative to a key or signals of various kinds of switches can be input to the body system control unit 12020. The body system control unit 12020 receives these input radio waves or signals, and controls a door lock device, the power window device, the lamps, or the like of the vehicle.

The outside-vehicle information detecting unit 12030 detects information about the outside of the vehicle including the vehicle control system 12000. For example, the outside-vehicle information detecting unit 12030 is connected with an imaging section 12031. The outside-vehicle information detecting unit 12030 makes the imaging section 12031 image an image of the outside of the vehicle, and receives the imaged image. On the basis of the received image, the outside-vehicle information detecting unit 12030 may perform processing of detecting an object such as a human, a vehicle, an obstacle, a sign, a character on a road surface, or the like, or processing of detecting a distance thereto.

The imaging section 12031 is an optical sensor that receives light, and which outputs an electric signal corresponding to a received light amount of the light. The imaging section 12031 can output the electric signal as an image, or can output the electric signal as information about a measured distance. In addition, the light received by the imaging section 12031 may be visible light, or may be invisible light such as infrared rays or the like.

The in-vehicle information detecting unit 12040 detects information about the inside of the vehicle. The in-vehicle information detecting unit 12040 is, for example, connected with a driver state detecting section 12041 that detects the state of a driver. The driver state detecting section 12041, for example, includes a camera that images the driver. On the basis of detection information input from the driver state detecting section 12041, the in-vehicle information detecting unit 12040 may calculate a degree of fatigue of the driver or a degree of concentration of the driver, or may determine whether the driver is dozing.

The microcomputer 12051 can calculate a control target value for the driving force generating device, the steering mechanism, or the braking device on the basis of the information about the inside or outside of the vehicle which information is obtained by the outside-vehicle information detecting unit 12030 or the in-vehicle information detecting unit 12040, and output a control command to the driving system control unit 12010. For example, the microcomputer 12051 can perform cooperative control intended to implement functions of an advanced driver assistance system (ADAS) which functions include collision avoidance or shock mitigation for the vehicle, following driving based on a following distance, vehicle speed maintaining driving, a warning of collision of the vehicle, a warning of deviation of the vehicle from a lane, or the like.

In addition, the microcomputer 12051 can perform cooperative control intended for automatic driving, which makes the vehicle to travel autonomously without depending on the operation of the driver, or the like, by controlling the driving force generating device, the steering mechanism, the braking device, or the like on the basis of the information about the outside or inside of the vehicle which information is obtained by the outside-vehicle information detecting unit 12030 or the in-vehicle information detecting unit 12040.

In addition, the microcomputer 12051 can output a control command to the body system control unit 12020 on the basis of the information about the outside of the vehicle which information is obtained by the outside-vehicle information detecting unit 12030. For example, the microcomputer 12051 can perform cooperative control intended to prevent a glare by controlling the headlamp so as to change from a high beam to a low beam, for example, in accordance with the position of a preceding vehicle or an oncoming vehicle detected by the outside-vehicle information detecting unit 12030.

The sound/image output section 12052 transmits an output signal of at least one of a sound and an image to an output device capable of visually or auditorily notifying information to an occupant of the vehicle or the outside of the vehicle. In the example of FIG. 21, an audio speaker 12061, a display section 12062, and an instrument panel 12063 are illustrated as the output device. The display section 12062 may, for example, include at least one of an on-board display and a head-up display.

Figure 22:
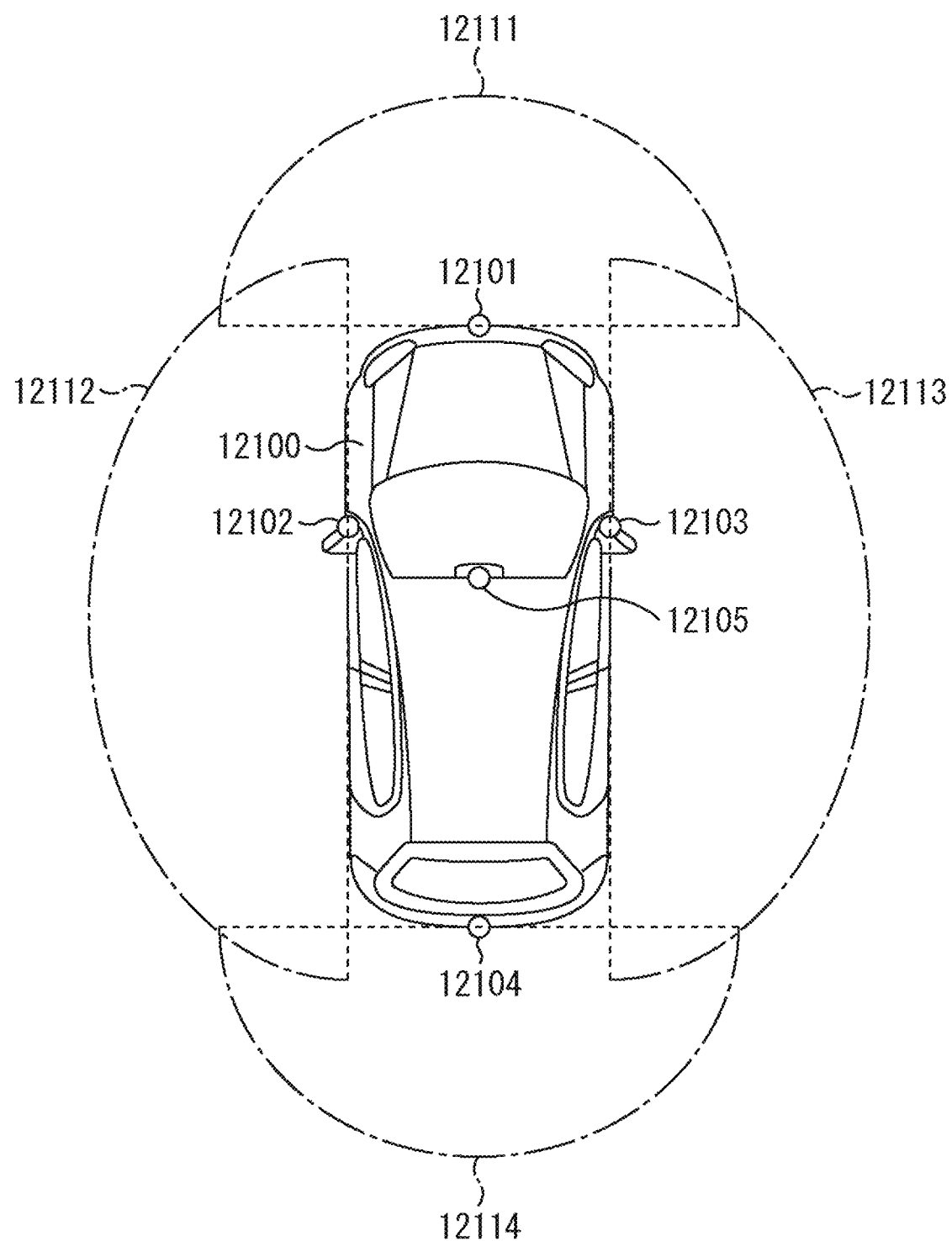
FIG. 22 is a diagram of assistance in explaining an example of installation positions of an outside-vehicle information detecting section and an imaging section.

FIG. 22 is a diagram depicting an example of the installation position of the imaging section 12031.

In FIG. 22, the imaging section 12031 includes imaging sections 12101, 12102, 12103, 12104, and 12105.

The imaging sections 12101, 12102, 12103, 12104, and 12105 are, for example, disposed at positions on a front nose, sideview mirrors, a rear bumper, and a back door of the vehicle 12100 as well as a position on an upper portion of a windshield within the interior of the vehicle. The imaging section 12101 provided to the front nose and the imaging section 12105 provided to the upper portion of the windshield within the interior of the vehicle obtain mainly an image of the front of the vehicle 12100. The imaging sections 12102 and 12103 provided to the sideview mirrors obtain mainly an image of the sides of the vehicle 12100. The imaging section 12104 provided to the rear bumper or the back door obtains mainly an image of the rear of the vehicle 12100. The image of the front obtained by the imaging sections 12101 and 12105 is used mainly to detect a preceding vehicle, a pedestrian, an obstacle, a signal, a traffic sign, a lane, or the like.

Incidentally, FIG. 22 depicts an example of photographing ranges of the imaging sections 12101 to 12104. An imaging range 12111 represents the imaging range of the imaging section 12101 provided to the front nose. Imaging ranges 12112 and 12113 respectively represent the imaging ranges of the imaging sections 12102 and 12103 provided to the sideview mirrors. An imaging range 12114 represents the imaging range of the imaging section 12104 provided to the rear bumper or the back door. A bird's-eye image of the vehicle 12100 as viewed from above is obtained by superimposing image data imaged by the imaging sections 12101 to 12104, for example.

At least one of the imaging sections 12101 to 12104 may have a function of obtaining distance information. For example, at least one of the imaging sections 12101 to 12104 may be a stereo camera constituted of a plurality of imaging elements, or may be an imaging element having pixels for phase difference detection.

For example, the microcomputer 12051 can determine a distance to each three-dimensional object within the imaging ranges 12111 to 12114 and a temporal change in the distance (relative speed with respect to the vehicle 12100) on the basis of the distance information obtained from the imaging sections 12101 to 12104, and thereby extract, as a preceding vehicle, a nearest three-dimensional object in particular that is present on a traveling path of the vehicle 12100 and which travels in substantially the same direction as the vehicle 12100 at a predetermined speed (for example, equal to or more than 0 km/hour). Further, the microcomputer 12051 can set a following distance to be maintained in front of a preceding vehicle in advance, and perform automatic brake control (including following stop control), automatic acceleration control (including following start control), or the like. It is thus possible to perform cooperative control intended for automatic driving that makes the vehicle travel autonomously without depending on the operation of the driver or the like.

For example, the microcomputer 12051 can classify three-dimensional object data on three-dimensional objects into three-dimensional object data of a two-wheeled vehicle, a standard-sized vehicle, a large-sized vehicle, a pedestrian, a utility pole, and other three-dimensional objects on the basis of the distance information obtained from the imaging sections 12101 to 12104, extract the classified three-dimensional object data, and use the extracted three-dimensional object data for automatic avoidance of an obstacle. For example, the microcomputer 12051 identifies obstacles around the vehicle 12100 as obstacles that the driver of the vehicle 12100 can recognize visually and obstacles that are difficult for the driver of the vehicle 12100 to recognize visually. Then, the microcomputer 12051 determines a collision risk indicating a risk of collision with each obstacle. In a situation in which the collision risk is equal to or higher than a set value and there is thus a possibility of collision, the microcomputer 12051 outputs a warning to the driver via the audio speaker 12061 or the display section 12062, and performs forced deceleration or avoidance steering via the driving system control unit 12010. The microcomputer 12051 can thereby assist in driving to avoid collision.

At least one of the imaging sections 12101 to 12104 may be an infrared camera that detects infrared rays. The microcomputer 12051 can, for example, recognize a pedestrian by determining whether or not there is a pedestrian in imaged images of the imaging sections 12101 to 12104. Such recognition of a pedestrian is, for example, performed by a procedure of extracting characteristic points in the imaged images of the imaging sections 12101 to 12104 as infrared cameras and a procedure of determining whether or not it is the pedestrian by performing pattern matching processing on a series of characteristic points representing the contour of the object. When the microcomputer 12051 determines that there is a pedestrian in the imaged images of the imaging sections 12101 to 12104, and thus recognizes the pedestrian, the sound/image output section 12052 controls the display section 12062 so that a square contour line for emphasis is displayed so as to be superimposed on the recognized pedestrian. The sound/image output section 12052 may also control the display section 12062 so that an icon or the like representing the pedestrian is displayed at a desired position.

An example of the vehicle control system to which the technology according to the present disclosure is applicable has been described above. The technology according to the present disclosure is applicable to the imaging section 12031 in the configuration described above. For example, each of the imaging element 100 in FIG. 1, the imaging element 400 in FIG. 18, and the imaging device 600 in FIG. 19 is applicable to the imaging section 12031. In this manner, image quality deterioration of a captured image can be reduced by applying the technology of the present disclosure to the imaging section 12031. Accordingly, more accurate (more appropriate) mobile body control and driving assistance are achievable on the basis of the captured image.

7. Supplementary Notes

<Application Targets of Present Technology>

The present technology can be implemented in the form of any configurations mounted on any devices or devices constituting systems (i.e., configurations of a part of devices), such as a processor (e.g., video processor) constituting a system LSI (Large Scale Integration) or the like, a module (e.g., video module) using a plurality of processors or the like, a unit (e.g., video unit) using a plurality of modules or the like, a set (e.g., video set) as a unit to which other functions are added.

Moreover, the present technology is also applicable to a network system constituted by a plurality of devices. For example, the present technology is also applicable to a cloud service which provides services associated with images (moving images) for any terminals such as a computer, an AV (Audio Visual) device, a portable information processing terminal, and an IoT (Internet of Things) device.

<Others>

Note that embodiments of the present technology are not limited to the embodiments described above, but may be modified in various manners without departing from the subject matters of the present technology.

Moreover, for example, a configuration explained as one device (or processing unit) may be divided into parts constituting a plurality of devices (or processing units). Conversely, a configuration explained above as a plurality of devices (or processing units) may be collected into one device (or processing unit). Furthermore, needless to say, a configuration not described above may be added to a configuration of each device (or each processing unit). In addition, a part of a configuration of a certain device (or processing unit) may be included in a configuration of another device (or another processing unit) as long as configurations or operations of entire systems of these devices are substantially similar.

Note that a system in the present description refers to a set of a plurality of constituent elements (devices, modules (parts) or the like). A set of constituent elements are regarded as a system regardless of whether or not all of the constituent elements are contained in an identical housing. Accordingly, a plurality of devices accommodated in different housings and connected to each other via a network, and one device which contains a plurality of modules in one housing are both regarded as a system.

Moreover, for example, the present technology is allowed to have a configuration of cloud computing where one function is shared and processed by cooperative operations of a plurality of devices via a network.

Moreover, for example, the program described above is allowed to be executed by any device. In this case, it is sufficient if this device has a necessary function (function block or the like), and is capable of obtaining necessary information.

Furthermore, for example, each of the steps explained with reference to the flowchart described above is allowed to be executed using one device, or shared and executed by a plurality of devices. In addition, in a case where a plurality of processes is contained in one step, the plurality of processes contained in the one step is allowed to be executed by one device, or shared and executed by a plurality of devices. In other words, the plurality of processes contained in the one step may be executed as processes in a plurality of steps. Conversely, a process executed as a plurality of steps in the above description may be collected and executed as one step.

Note that the program executed by the computer may be a program where processes in steps describing the program are executed in time series in an order described in the present description, or a program where these processes are executed in parallel or individually at necessary timing such as an occasion of a call. In other words, the processes in the respective steps may be executed in an order different from the order described above as long as no inconsistency is produced. Furthermore, the processes in the steps describing the program may be executed in parallel with processes of another program, or may be executed in combination with processes of another program.

Note that a plurality of items of the present technology described in the present description may be practiced independently and individually as long as no inconsistency is produced. Needless to say, any plural number of items of the present technology may be practiced in combination with each other. For example, a part or all of the present technology described in any one of the embodiments may be practiced in combination with a part or all of the present technology described in a different one of the embodiments. In addition, a part or all of any item of the present technology described above may be practiced in combination with another technology not described above.

Note that the present technology can also take the following configurations.

(1)

An imaging element including a pixel unit that includes a selection transistor and an amplification transistor each constituted by a multigate transistor.

(2)

The imaging element according to (1), in which the multigate transistor is a FinFET.

(3)

The imaging element according to (1) or (2), in which the selection transistor and the amplification transistor are formed adjacent to each other.

(4)

The imaging element according to (3), in which an interval between gates of the selection transistor and the amplification transistor adjacent to each other is 100 nm or longer.

(5)

The imaging element according to any one of (1) to (4), in which gates of the selection transistor and the amplification transistor are formed on an identical silicon channel.

(6)

The imaging element according to any one of (1) to (5), in which, in the pixel unit, each of the selection transistor and the amplification transistor is formed in a row different from rows where a transfer transistor and a reset transistor are formed.

(7)

The imaging element according to any one of (1) to (6), in which
the pixel unit includes a single photoelectric conversion element,
the selection transistor controls output of charge read from the photoelectric conversion element to a signal line, and
the amplification transistor amplifies a signal in a case where the selection transistor outputs the charge to the signal line as the signal.

(8)

The imaging element according to any one of (1) to (7), in which
the pixel unit includes a plurality of photoelectric conversion elements,
the selection transistor controls output of charge read from any one of the plurality of photoelectric conversion elements to a signal line, and
the amplification transistor amplifies a signal in a case where the selection transistor outputs the charge to the signal line as the signal.

(9)

The imaging element according to any one of (1) to (8), in which the selection transistor includes a silicon channel into which an impurity has been injected.

(10)

The imaging element according to any one of (1) to (9), in which the selection transistor includes a silicon channel that includes a P-type semiconductor into which an ion having a smaller thermal diffusivity than a thermal diffusivity of boron has been injected.

(11)

The imaging element according to any one of (1) to (10), in which the selection transistor includes a silicon channel that includes a P-type semiconductor into which indium has been injected.

(12)

The imaging element according to any one of (1) to (11), in which the selection transistor includes a silicon channel that includes an N-type semiconductor into which an ion having a smaller thermal diffusivity than a thermal diffusivity of phosphorous has been injected.

(13)

The imaging element according to any one of (1) to (12), in which the selection transistor includes a silicon channel that includes an N-type semiconductor into which arsenic has been injected.

(14)

The imaging element according to any one of (1) to (13), in which the selection transistor includes a silicon channel that includes an N-type semiconductor into which antimony has been injected.

(15)

The imaging element according to any one of (1) to (14), in which the selection transistor includes a silicon channel into which an impurity has been injected before formation of a side wall of a gate.

(16)

The imaging element according to any one of (1) to (15), in which the selection transistor includes a silicon channel into which an impurity has been injected after formation of a side wall of a gate.

(17)

The imaging element according to any one of (1) to (16), in which each of the selection transistor and the amplification transistor includes a gate electrode, a work function of a material of the gate electrode of the selection transistor being different from a work function of a material of the gate electrode of the amplification transistor.

(18)

The imaging element according to any one of (1) to (17), in which
the selection transistor includes a gate electrode including a P-type semiconductor, and
the amplification transistor includes a gate electrode including an N-type semiconductor.

(19)
The imaging element according to any one of (1) to (18), in which
the selection transistor includes a gate electrode including tungsten, ruthenium, or rhodium, and
the amplification transistor includes a gate electrode including an N-type semiconductor.
(20)
An imaging device including:
an imaging unit that images an object; and
an image processing unit that performs image processing for image data obtained by imaging using the imaging unit,
in which the imaging unit includes a pixel unit that includes a selection transistor and an amplification transistor each constituted by a multigate transistor.

REFERENCE SIGNS LIST

100: Imaging element
111: Photodiode
112: Transfer transistor
113: Reset transistor
114: Amplification transistor
114A: Gate electrode
115: Transfer transistor
115A: Gate electrode
121: Silicon layer
121A: Silicon channel
122: Insulation film
131: Ion injection region
141, 142: Gate side wall
143: Electrode
200: Manufacturing device
211: Fin forming unit
212: SiO2 forming unit
213: Ion injection unit
214: SiO2 exposure unit
215: Etching unit
216: Resist removal unit
217: Annealing unit
218: Gate forming unit
251: AMP forming region
252: SEL forming region
261: Photoresist
261A: Opening
311, 312: Gate electrode
400: Imaging element
411, 412: Pixel unit
600: Imaging device
612: CMOS image sensor
613: Image processing unit
900: Computer

The invention claimed is:

1. A light detecting element comprising:
a pixel unit that includes a selection transistor and an amplification transistor each constituted by a multigate transistor, wherein
a gate of the selection transistor is disposed on a first portion of a fin structure,
a gate of the amplification transistor is disposed on a second portion of the fin structure, and
the gates of the selection transistor and the amplification transistor are formed on a same silicon channel.

2. The light detecting element according to claim 1, wherein the multigate transistor is a FinFET.

3. The light detecting element according to claim 1, wherein the selection transistor and the amplification transistor are formed adjacent to each other.

4. The light detecting element according to claim 1, wherein, in the pixel unit, each of the selection transistor and the amplification transistor is formed in a row different from rows where a transfer transistor and a reset transistor are formed.

5. The light detecting element according to claim 1, wherein
the pixel unit includes a single photoelectric conversion element,
the selection transistor controls output of charge read from the photoelectric conversion element to a signal line, and
the amplification transistor amplifies a signal in a case where the selection transistor outputs the charge to the signal line as the signal.

6. The light detecting element according to claim 1, wherein
the pixel unit includes a plurality of photoelectric conversion elements,
the selection transistor controls output of charge read from any one of the plurality of photoelectric conversion elements to a signal line, and
the amplification transistor amplifies a signal in a case where the selection transistor outputs the charge to the signal line as the signal.

7. The light detecting element according to claim 1, wherein the selection transistor includes a silicon channel that includes a P-type semiconductor into which an ion having a smaller thermal diffusivity than a thermal diffusivity of boron has been injected.

8. The light detecting element according to claim 1, wherein the selection transistor includes a silicon channel that includes a P-type semiconductor into which indium has been injected.

9. The light detecting element according to claim 1, wherein the selection transistor includes a silicon channel that includes an N-type semiconductor into which an ion having a smaller thermal diffusivity than a thermal diffusivity of phosphorous has been injected.

10. The light detecting element according to claim 1, wherein the selection transistor includes a silicon channel that includes an N-type semiconductor into which arsenic has been injected.

11. The light detecting element according to claim 1, wherein the selection transistor includes a silicon channel that includes an N-type semiconductor into which antimony has been injected.

12. The light detecting element according to claim 1, wherein the selection transistor includes a silicon channel into which an impurity has been injected before formation of a side wall of a gate.

13. The light detecting element according to claim 1, wherein the selection transistor includes a silicon channel into which an impurity has been injected after formation of a side wall of a gate.

14. The light detecting element according to claim 1, wherein each of the selection transistor and the amplification transistor includes a gate electrode, a work function of a material of the gate electrode of the selection transistor being different from a work function of a material of the gate electrode of the amplification transistor.

15. The light detecting element according to claim 1, wherein the selection transistor includes a gate electrode including a P-type semiconductor, and the amplification transistor includes a gate electrode including an N-type semiconductor.

16. A light detecting element comprising:

a pixel unit that includes a selection transistor and an amplification transistor each constituted by a multigate transistor, wherein a gate of the selection transistor is disposed on a first portion of a fin structure, a gate of the amplification transistor is disposed on a second portion of the fin structure, the selection transistor and the amplification transistor are formed adjacent to each other, and an interval between the gates of the selection transistor and the amplification transistor is 100 nm or longer.

17. A light detecting element comprising:

a pixel unit that includes a selection transistor and an amplification transistor each constituted by a multigate transistor, wherein a gate of the selection transistor is disposed on a first portion of a fin structure, a gate of the amplification transistor is disposed on a second portion of the fin structure, and the selection transistor includes a silicon channel into which an impurity has been injected.

18. A light detecting element comprising:

a pixel unit that includes a selection transistor and an amplification transistor each constituted by a multigate transistor, wherein a gate of the selection transistor is disposed on a first portion of a fin structure, a gate of the amplification transistor is disposed on a second portion of the fin structure, the selection transistor includes a gate electrode including tungsten, ruthenium, or rhodium, and the amplification transistor includes a gate electrode including an N-type semiconductor.

19. An imaging device comprising:

a light detecting element that images an object; and an image processor configured to perform image processing for image data obtained by imaging using the light detecting element, wherein the light detecting element includes a pixel unit that includes a selection transistor and an amplification transistor each constituted by a multigate transistor, a gate of the selection transistor is disposed on a first portion of a fin structure, a gate of the amplification transistor is disposed on a second portion of the fin structure, and the gates of the selection transistor and the amplification transistor are formed on a same silicon channel.

* * * * *